US009035538B2

(12) United States Patent
Ariji et al.

(10) Patent No.: US 9,035,538 B2
(45) Date of Patent: May 19, 2015

(54) PIEZOELECTRIC VIBRATING PIECE AND PIEZOELECTRIC DEVICE

(71) Applicant: NIHON DEMPA KOGYO CO., LTD., Tokyo (JP)

(72) Inventors: Takumi Ariji, Saitama (JP); Takehiro Takahashi, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 431 days.

(21) Appl. No.: 13/663,483

(22) Filed: Oct. 30, 2012

(65) Prior Publication Data
US 2013/0106249 A1    May 2, 2013

(30) Foreign Application Priority Data

Nov. 2, 2011 (JP) ................................. 2011-240799
Nov. 2, 2011 (JP) ................................. 2011-240800

(51) Int. Cl.

| | |
|---|---|
| *H01L 41/053* | (2006.01) |
| *H03H 9/02* | (2006.01) |
| *H03H 9/05* | (2006.01) |
| *H03H 9/10* | (2006.01) |
| *H03H 9/19* | (2006.01) |

(52) U.S. Cl.
CPC .......... *H03H 9/02157* (2013.01); *H03H 9/0595* (2013.01); *H03H 9/1035* (2013.01); *H03H 9/19* (2013.01)

(58) Field of Classification Search
CPC .... H01L 41/0926; H01L 41/053; H03H 9/24; H03H 9/1021

USPC .......................................... 310/321, 348, 368
See application file for complete search history.

(56) References Cited

U.S. PATENT DOCUMENTS

| | | | | |
|---|---|---|---|---|
| 6,396,201 | B1 * | 5/2002 | Ide et al. ..................... | 310/353 |
| 2006/0175939 | A1 * | 8/2006 | Murata ........................ | 310/368 |
| 2008/0179998 | A1 * | 7/2008 | Kawashima ................. | 310/370 |
| 2010/0207696 | A1 * | 8/2010 | Sayama ....................... | 331/158 |
| 2011/0095657 | A1 * | 4/2011 | Yamashita et al. .......... | 310/367 |
| 2011/0316390 | A1 * | 12/2011 | Umeki et al. ................ | 310/344 |

FOREIGN PATENT DOCUMENTS

JP         2007-214942         8/2007

* cited by examiner

*Primary Examiner* — Derek Rosenau
*Assistant Examiner* — Bryan Gordon
(74) *Attorney, Agent, or Firm* — Jianq Chyun IP Office

(57) ABSTRACT

A piezoelectric vibrating piece includes an excitation unit in a rectangular shape, a framing portion, a connecting portion, and a protrusion. The excitation unit includes a pair of excitation electrodes on the pair of principal surfaces, a first side that extends in a first direction, and a second side that extends in a second direction. The second side is longer than the first side. The second direction is perpendicular to the first direction. The connecting portion connects the first side of the excitation unit to the framing portion. The connecting portion is thinner than the framing portion. The protrusion protrudes in the thickness direction in at least one of the connecting portion and a region between the connecting portion and the excitation electrode. The length of the protrusion in the first direction is equal to or longer than a length of the connecting portion in the first direction.

16 Claims, 19 Drawing Sheets

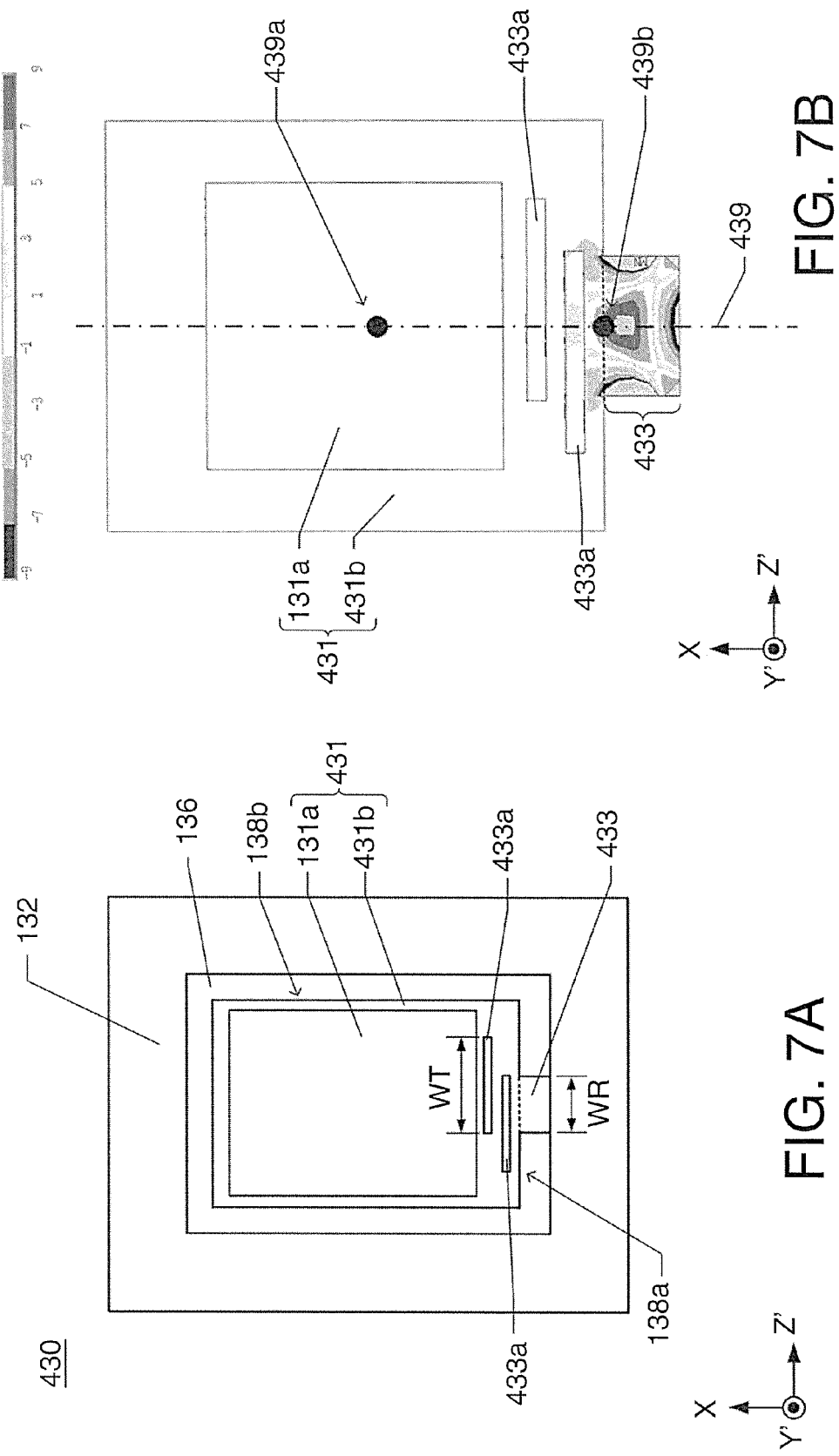

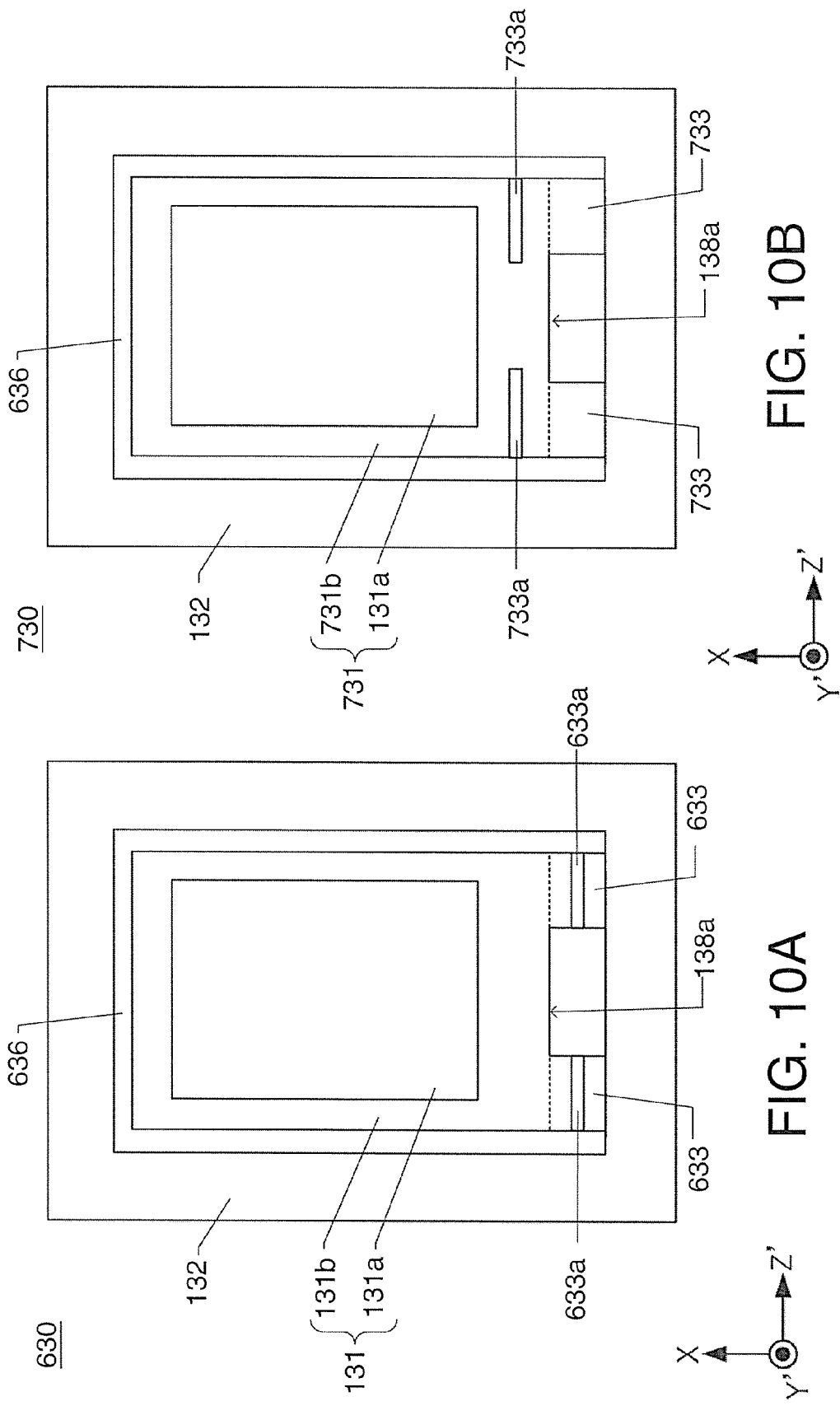

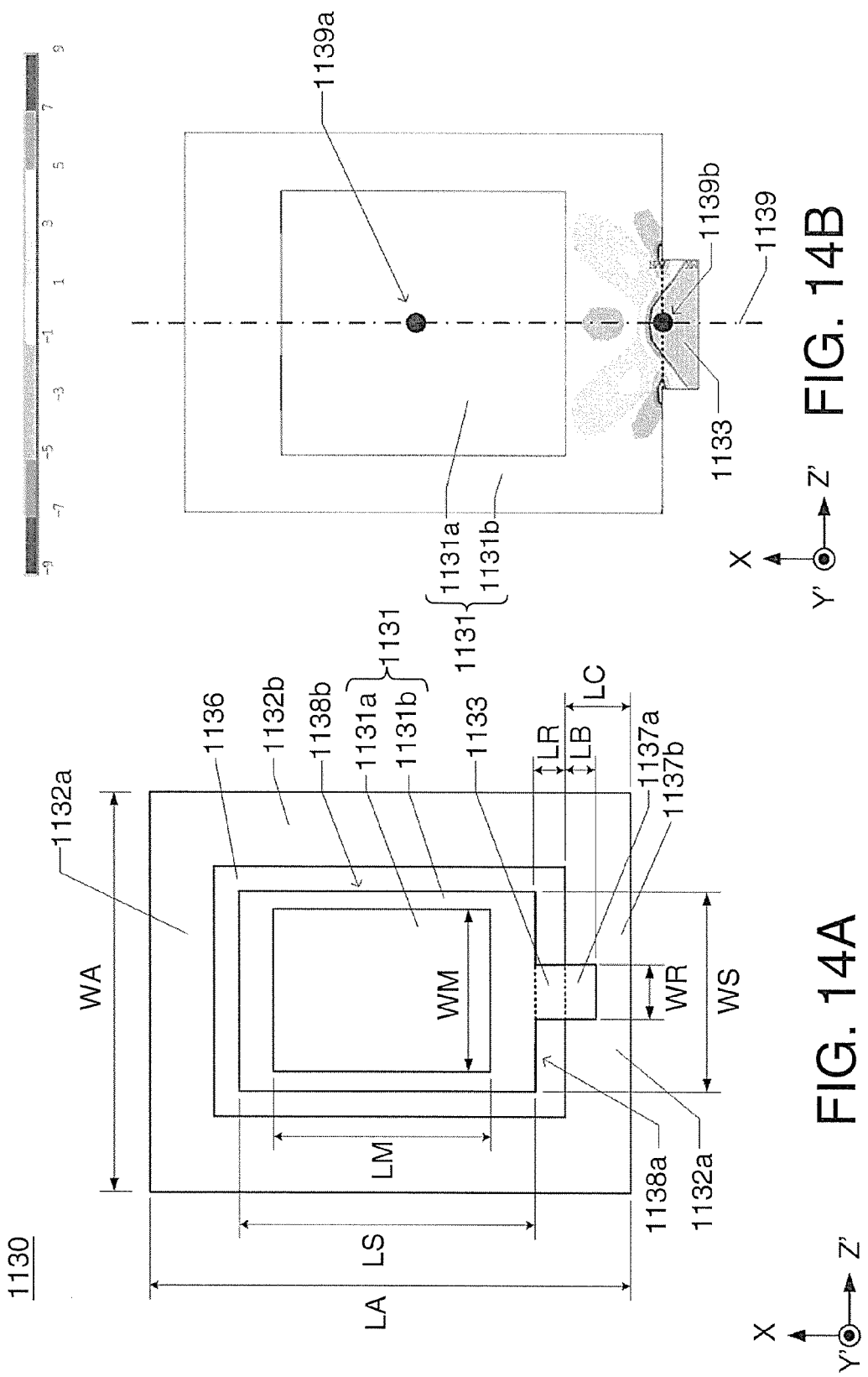

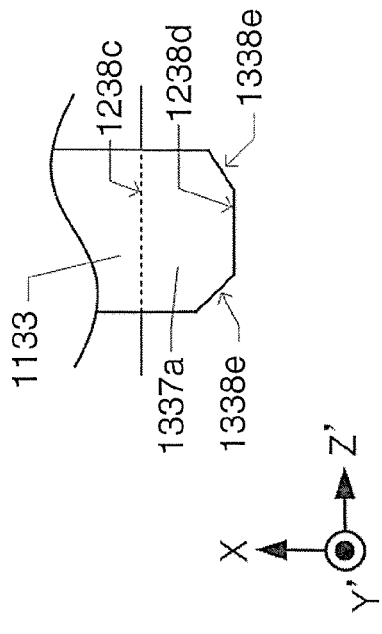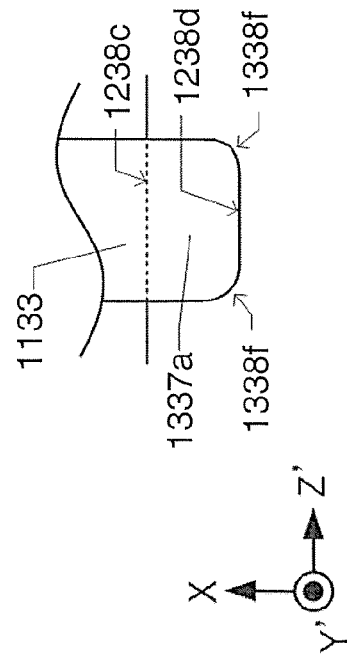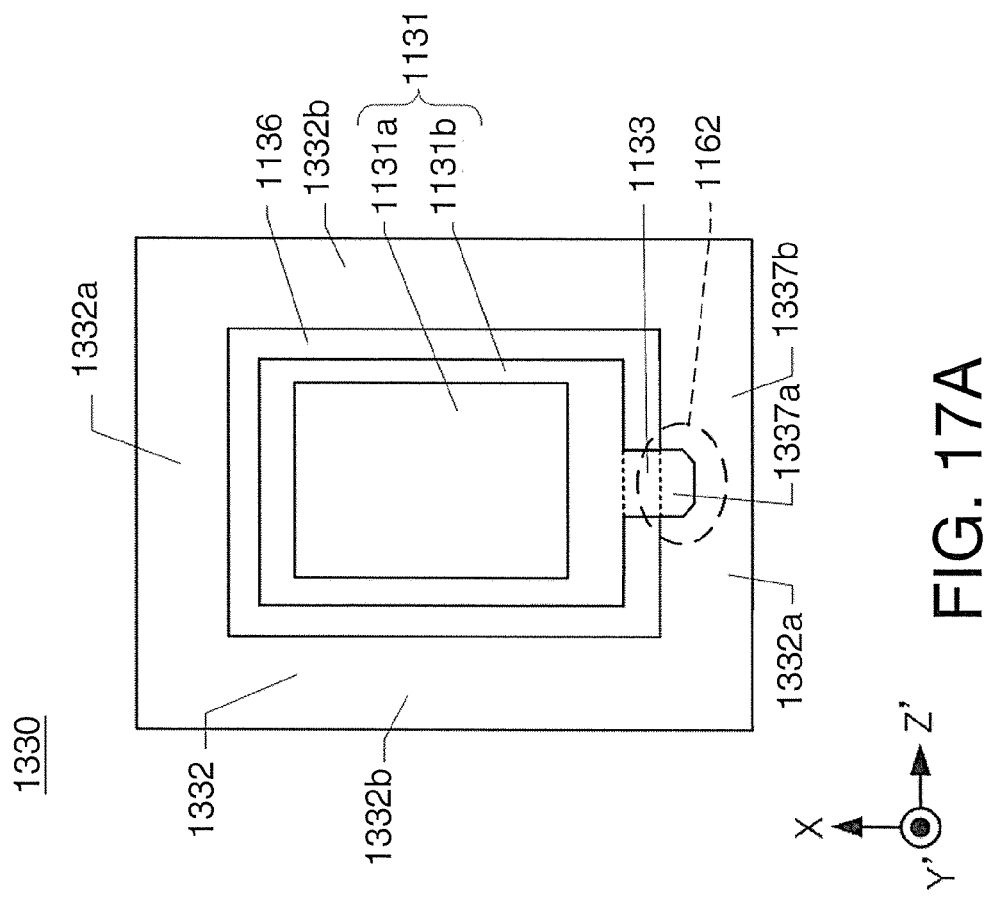
FIG. 17B
FIG. 17C
FIG. 17A

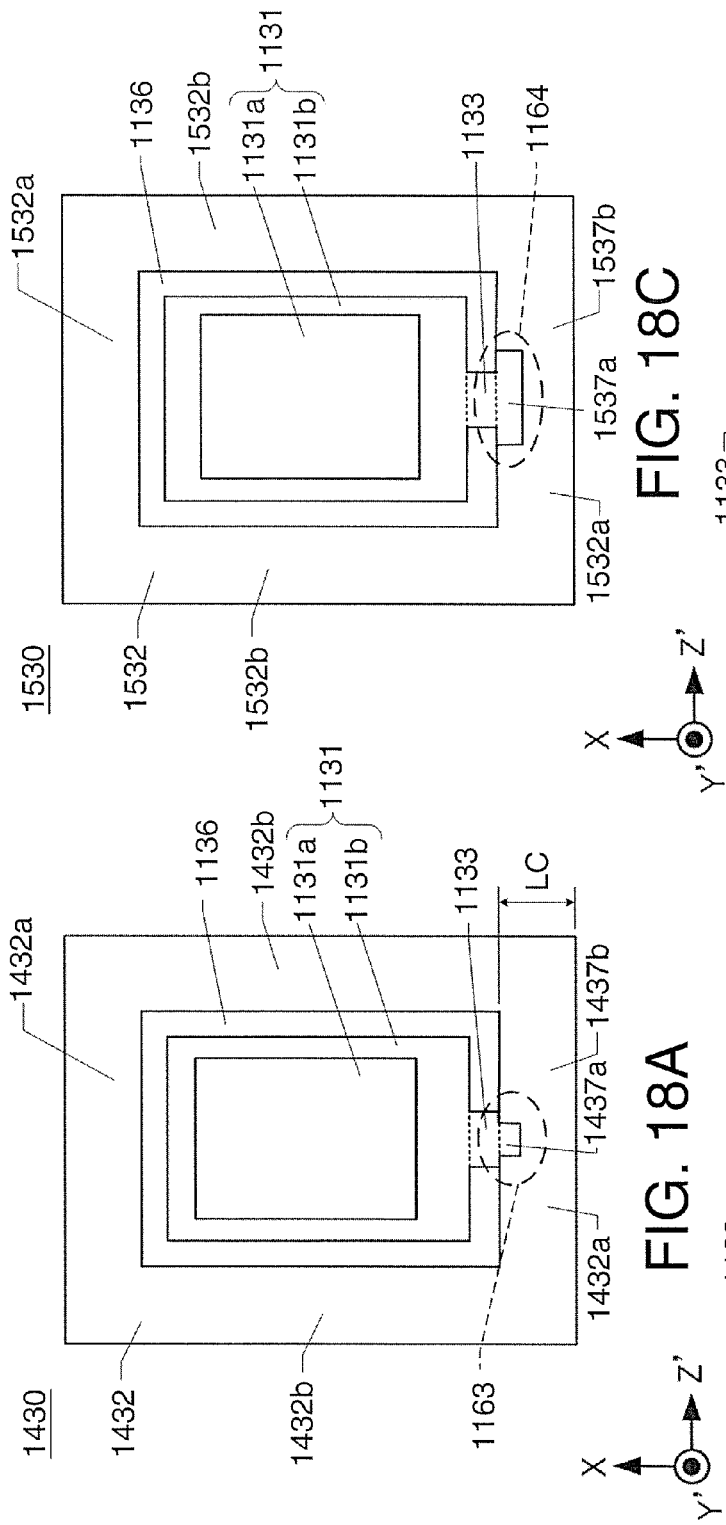
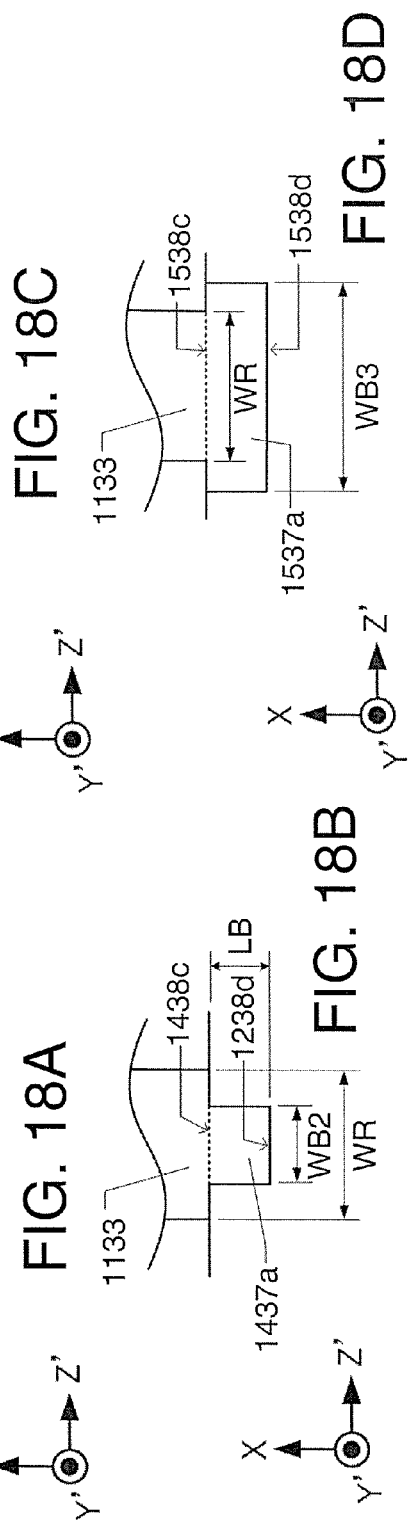

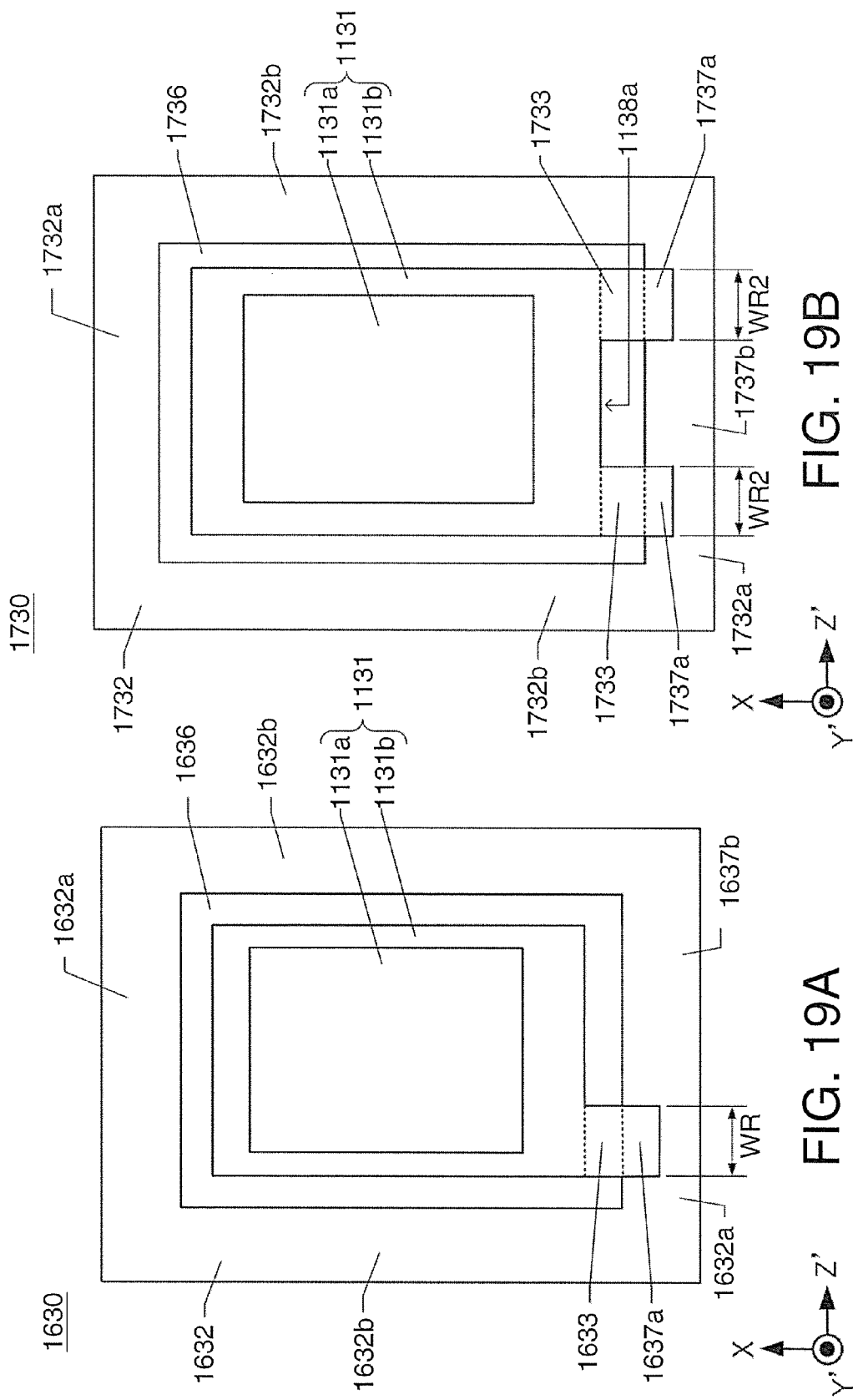

PIEZOELECTRIC VIBRATING PIECE AND PIEZOELECTRIC DEVICE

CROSS-REFERENCE TO RELATED APPLICATIONS

This application claims the priority benefit of Japan application serial no. 2011-240799 and 2011-240800, both of which are filed on Nov. 2, 2011. The entirety of each of the above-mentioned patent applications is hereby incorporated by reference herein and made a part of this specification.

TECHNICAL FIELD

This disclosure relates to a piezoelectric vibrating piece and a piezoelectric device that reduce influence of stresses on excitation units.

DESCRIPTION OF THE RELATED ART

A known piezoelectric vibrating piece includes an excitation unit which vibrates at a predetermined frequency, a framing portion which surrounds a peripheral area of the excitation unit, and a connecting portion which connects the excitation unit and the framing portion together. The piezoelectric vibrating piece makes a piezoelectric device with a lid plate and a base plate, which are bonded on front and back sides of its framing portion. The piezoelectric device is used being mounted on a printed circuit board or a similar device. The piezoelectric device may undergo stress on the printed circuit board. The stress on the piezoelectric device affects the piezoelectric vibrating piece, thus changing a characteristic of the vibration frequency of the excitation unit.

To solve this problem, for example, Japanese Unexamined Patent Application Publication No. 2007-214942 discloses an expectation that a saw tooth-shaped notch in a connecting portion reduces stress transferring from the framing portion to the excitation unit. The publication discloses as follows. In the case where the notch has a depth that is equal to or more than half of the framing portion, the framing portion is connected to the excitation unit not in a straight line. In this case, an actual transfer distance of heat and stress increases, thus ensuring a significant buffering effect.

However, the piezoelectric vibrating piece in Japanese Unexamined Patent Application Publication No. 2007-214942 has the notch in the connecting portion. This possibly causes a vulnerability to dropping impact and similar cause. Nowadays, the piezoelectric vibrating piece has become thinned to ensure a downsized piezoelectric device. The notch thus formed may reduce impact resistance. Japanese Unexamined Patent Application Publication No. 2007-214942 discloses a piezoelectric vibrating piece where the excitation unit is supported at both ends. The piezoelectric vibrating piece includes connecting portions at respective opposite sides of the excitation unit. In contrast, a piezoelectric vibrating piece that is supported at one end has a connecting portion alone at one side of the excitation unit. This configuration has a further reduced impact resistance. In view of this, there is a need for a piezoelectric vibrating piece that reduces influence of stress on the excitation unit, and also ensures sufficient impact resistance.

A need thus exists for a piezoelectric vibrating piece and a piezoelectric device which are not susceptible to the drawback mentioned above.

SUMMARY

According to an aspect of this disclosure, there is provided a piezoelectric vibrating piece that includes an excitation unit in a rectangular shape, a framing portion that surrounds the excitation unit, a connecting portion, and a protrusion. The excitation unit includes a pair of principal surfaces, a pair of excitation electrodes on the pair of principal surfaces, a first side that extends in a first direction, and a second side that extends in a second direction. The second side is longer than the first side. The second direction is perpendicular to the first direction. The connecting portion connects the first side of the excitation unit to the framing portion. The connecting portion is thinner than the framing portion. The protrusion protrudes in the thickness direction in at least one of the connecting portion and a region between the connecting portion and the excitation electrode.

The excitation electrode is disposed in the second direction of the connecting portion. The length of the protrusion in the first direction is equal to or longer than a length of the connecting portion in the first direction.

BRIEF DESCRIPTION OF THE DRAWINGS

The foregoing and additional features and characteristics of this disclosure will become more apparent from the following detailed description considered with the reference to the accompanying drawings, wherein:

FIG. 7A is a plan view of a piezoelectric vibrating piece 430 without electrodes;

FIG. 7B is a simulation result of a short side bend of the piezoelectric vibrating piece 430;

FIG. 10A is a plan view of a piezoelectric vibrating piece 630 without electrodes;

FIG. 10B is a plan view of a piezoelectric vibrating piece 730 without electrodes;

FIG. 14A is a plan view of a piezoelectric vibrating piece 1130 without electrodes;

FIG. 14B is a simulation result of a short side bend of the piezoelectric vibrating piece 1130;

FIG. 17A is a plan view of a piezoelectric vibrating piece 1330 without electrodes;

FIG. 17B is an enlarged view of a region enclosed by a dotted line 1162 of FIG. 17A;

FIG. 17C is a plan view of a first region 1337a where the corner portions are rounded with curved surfaces;

FIG. 18A is a plan view of a piezoelectric vibrating piece 1430 without electrodes;

FIG. 18B is an enlarged view of a region enclosed by a dotted line 1163 of FIG. 18A;

FIG. 18C is a plan view of a piezoelectric vibrating piece 1530 without electrodes;

FIG. 18D is an enlarged view of a region enclosed by a dotted line 1164 of FIG. 18C;

FIG. 19A is a plan view of a piezoelectric vibrating piece 1630 without electrodes; and FIG. 19B is a plan view of a piezoelectric vibrating piece 1730 without electrodes.

DETAILED DESCRIPTION

A first embodiment disclosed here will be explained with reference to the attached drawings.

Configuration of a Piezoelectric Device 100 According to a First Embodiment

Figure 1:
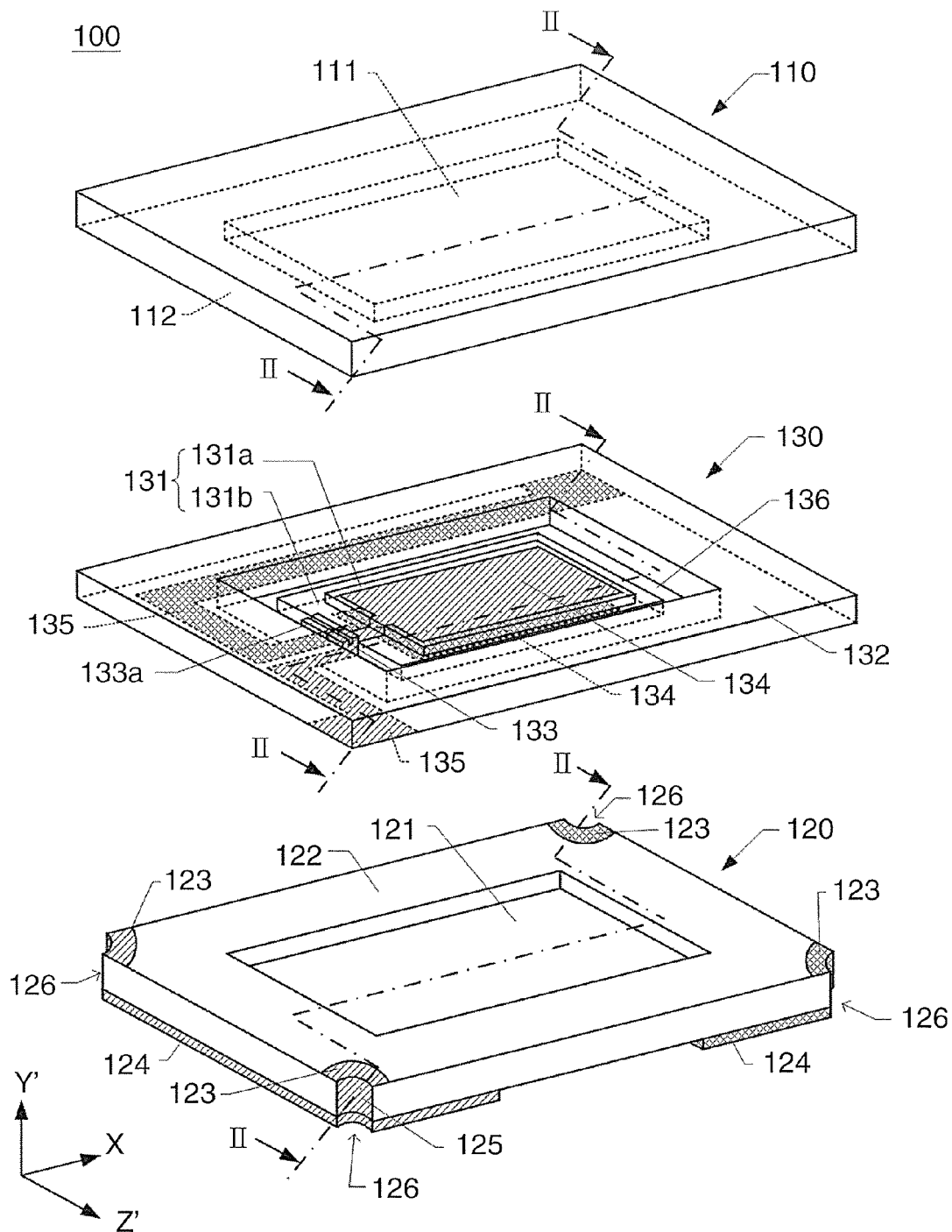
FIG. 1 is an exploded perspective view of a piezoelectric device 100.

FIG. 1 is an exploded perspective view of a piezoelectric device 100. The piezoelectric device 100 includes a lid plate 110, a base plate 120, and a piezoelectric vibrating piece 130. The piezoelectric vibrating piece 130 employs, for example, an AT-cut quartz-crystal vibrating piece. The AT-cut quartz-crystal vibrating piece has a principal surface (in the YZ plane) that is tilted by 35° 15' about the Y-axis of the crystallographic axis (XYZ) in the direction from the Z-axis to the Y-axis around the X-axis. In the following description, the new axes tilted with reference to the axis directions of the AT-cut quartz-crystal vibrating piece are denoted as the Y' axis and the Z' axis. Therefore, in the piezoelectric device 100, the longitudinal direction of the piezoelectric device 100 is referred to as the X axis direction, the height direction of the piezoelectric device 100 is referred to as the Y' axis direction, and the direction perpendicular to the X axis and the Y' axis directions is referred to as the Z' axis direction.

The piezoelectric vibrating piece 130 includes an excitation unit 131 which is formed in a rectangular shape and vibrates at a predetermined frequency, a framing portion 132 which surrounds the excitation unit 131, and one connecting portion 133 which connects the framing portion 132 and the excitation unit 131 together. In a region, which is other than the connecting portion 133 between the excitation unit 131 and the framing portion 132, a through hole 136 is formed. The through hole 136 passes through the piezoelectric vibrating piece 130 in the Y' axis direction. The excitation unit 131 includes the excitation electrodes 134 on the surfaces at the +Y' axis side and −Y' axis side. The excitation unit 131 includes a mesa region 131a with the excitation electrodes 134 and a peripheral region 131b, which is formed around the mesa region 131a and has a thinner thickness in the Y' axis direction than that of the mesa region 131a. From the excitation electrodes 134 on the surfaces at the +Y' axis side and the surface at the −Y' axis side, respective extraction electrodes 135 are extracted through the connecting portion 133 to the surface at the −Y' axis side of the framing portion 132. Additionally, on the surfaces at the +Y' axis side and the −Y' axis side of the connecting portion 133, protrusions 133a (see FIG. 2) are protruded from the connecting portion 133 in the Y' axis direction.

The base plate 120 is disposed at the −Y' axis side of the piezoelectric vibrating piece 130. The base plate 120 is formed in a rectangular shape that has long sides in the X axis direction and short sides in the Z' axis direction. The base plate 120 includes a pair of external electrodes 124 on the surface at the −Y' axis side. The external electrodes 124 are secured and electrically connected to a printed circuit board or a similar member via solder. This mounts the piezoelectric device 100 on the printed circuit board or a similar member. On side surfaces at four corners of the base plate 120, castellations 126 are formed, while castellation electrodes 125 are formed on the castellations 126. The base plate 120 includes a recess 121 on the surface at the +Y' axis side, while a bonding surface 122 is formed in a peripheral area of the recess 121. The bonding surface 122 includes connecting electrodes 123 in peripheral areas of the castellations 126 at the four corners. The connecting electrodes 123 are electrically connected to the external electrodes 124 via the castellation electrodes 125 on the castellation 126. The base plate 120 is bonded to the surface of the framing portion 132 at the −Y' axis side in the piezoelectric vibrating piece 130 via a sealing material 141 (see FIG. 2) on the bonding surface 122. The connecting electrodes 123 are electrically connected to the extraction electrodes 135 of the piezoelectric vibrating piece 130.

The lid plate 110 is disposed at the +Y' axis side of the piezoelectric vibrating piece 130. The lid plate 110 includes a recess 111 on its surface at the −Y' axis side, while a bonding surface 112 is formed in a peripheral area of the recess 111. The lid plate 110 is bonded to the surface of the framing portion 132 at the +Y' axis side in the piezoelectric vibrating piece 130 via the sealing material 141 (see FIG. 2) on the bonding surface 112.

Figure 2:
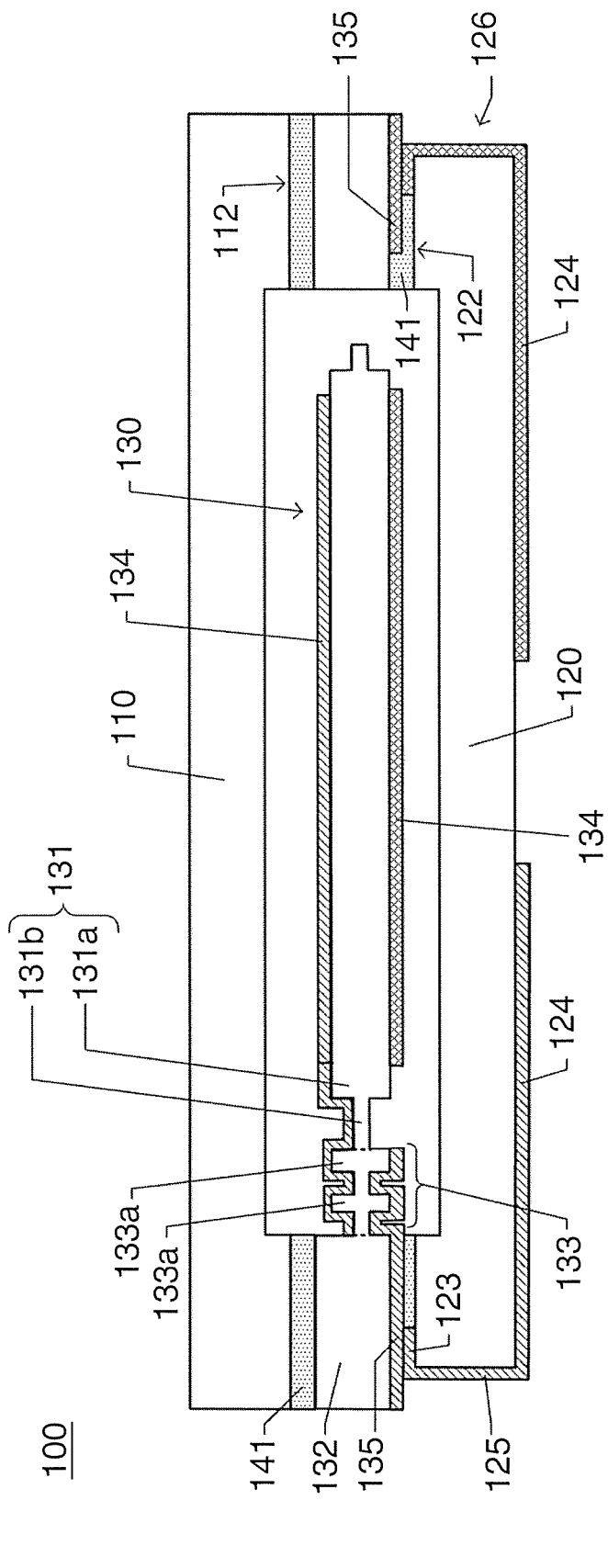
FIG. 2 is a cross-sectional view taken along the line II-II of FIG. 1.

FIG. 2 is a cross-sectional view taken along the line II-II of FIG. 1. The piezoelectric device 100 includes the piezoelectric vibrating piece 130 with the framing portion 132. On the surface at the +Y' axis side of the framing portion 132 of the piezoelectric vibrating piece 130, the bonding surface 112 on the lid plate 110 is bonded with a sealing material 141. On the surface at the −Y' axis side of the framing portion 132, the bonding surface 122 on the base plate 120 is bonded with the sealing material 141. When the piezoelectric vibrating piece 130 and the base plate 120 are bonded together, the extraction electrodes 135, which are formed on the surface of the framing portion 132 at the −Y' axis side, and the connecting electrodes 123, which are formed on the bonding surface 122 of the base plate 120, are electrically connected together. Thus, the respective excitation electrodes 134, which are formed on the +Y' axis side and the −Y' axis side of a mesa region 131a, are electrically connected to the external electrodes 124 via the extraction electrode 135, the connecting electrode 123, and the castellation electrode 125.

Figure 3A:
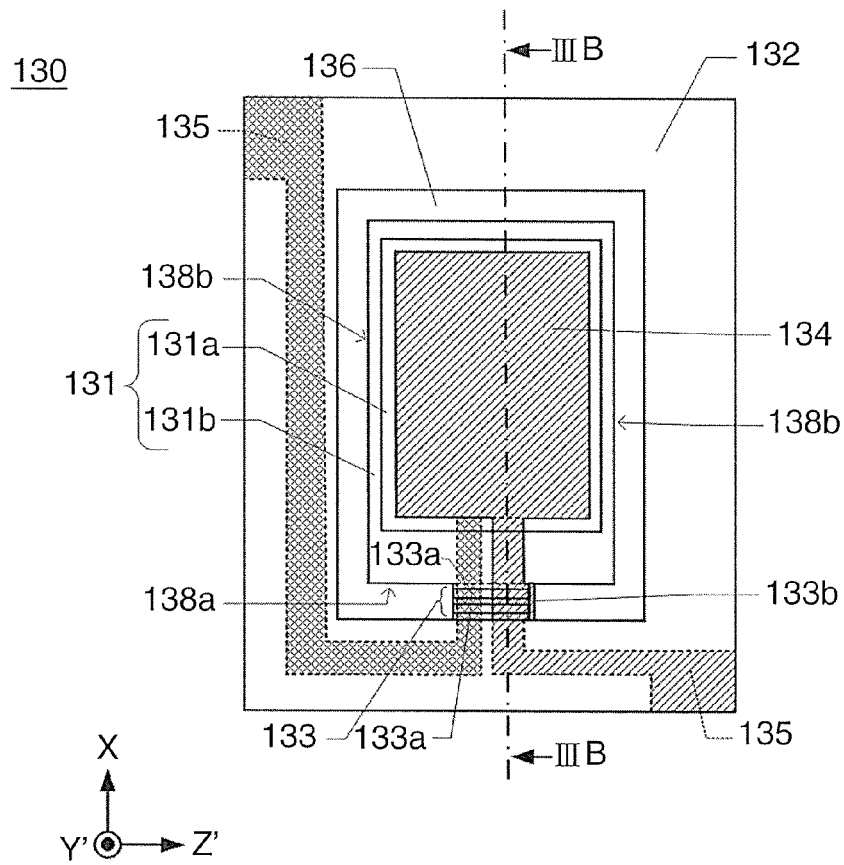
FIG. 3A is a plan view of a piezoelectric vibrating piece 130.

FIG. 3A is a plan view of the piezoelectric vibrating piece 130. The piezoelectric vibrating piece 130 includes the excitation unit 131 in a rectangular shape, the framing portion 132 which surrounds the excitation unit 131, one connecting portion 133 which connects the excitation unit 131 and the framing portion 132 together. The excitation unit 131 includes a first side 138a which is a side of the excitation unit 131 at the −X axis side, and second sides 138b which are sides of the excitation unit 131 at the +Z' axis side and the −Z' axis side. The connecting portion 133 is connected to the center of the first side 138a in the excitation unit 131, and then extends from this center, and is connected to the framing portion 132 in the −X axis direction. A region, which is other than the connecting portion 133, between the excitation unit 131 and the framing portion 132 forms a through hole 136 that passes through the piezoelectric vibrating piece 130 in the Y' axis direction. The excitation unit 131 has the peripheral region 131b that surrounds the mesa region 131a. From the excitation electrode 134 on the surface at the +Y' axis side of the mesa region 131a, the extraction electrodes 135 are extracted via the peripheral region 131b, the surface at the +Y' axis side of the connecting portion 133, a side surface 133b at the +Z' axis side of the connecting portion 133, and the surface at the −Y' axis side of the connecting portion 133, to the corner portion at the +Z' axis side and −X axis side on the surface of the −Y' axis side of the framing portion 132. From the excitation electrode 134 (see FIG. 3B) on the surface at the −Y' axis side of the mesa region 131a, the extraction electrode 135 is extracted via the surfaces at the −Y' axis sides of the peripheral region 131b and the connecting portion 133 to the framing portion 132. The extraction electrode 135 further extends on the surface at the −Y' axis side of the framing portion 132 in the −Z' axis direction and the +X axis direction. The extraction electrode 135 is extracted to the corner portion at the +X axis side and −Z' axis side on the surface of the −Y' axis side of the framing portion 132.

Figure 3B:
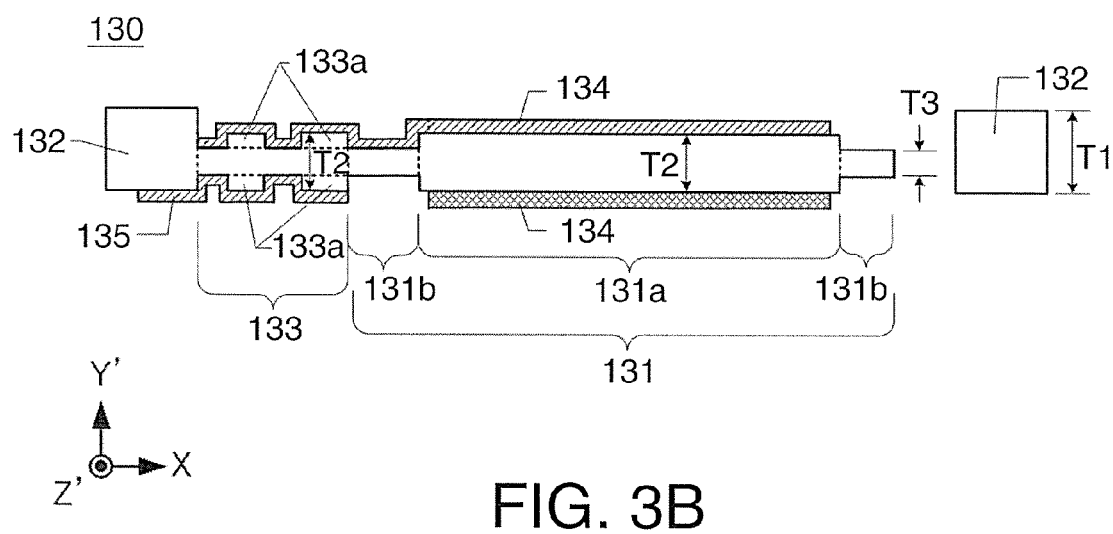
FIG. 3B is a cross-sectional view taken along the line IIIB-IIIB of FIG. 3A.

FIG. 3B is a cross-sectional view taken along the line IIIB-IIIB of FIG. 3A. The connecting portion 133 includes the protrusions 133a. The two protrusions 133a are formed on each of surfaces at the +Y' axis and −Y' axis sides of the connecting portion 133. The protrusions 133a, on the surface at the +Y' axis side and the protrusions 133a on the surface at the −Y' axis side, are formed so that they are mutually symmetrical in the Y' axis direction. Assume that in the piezoelectric vibrating piece 130, the framing portion 132 has a thickness T1 in the Y' axis direction, the connecting portion 133 at the region where the protrusions 133a are formed and the mesa region 131a have a thickness T2 in the Y' axis direction, and the connecting portion 133 at the region where the protrusions 133a are not formed and the peripheral region 131b have a thickness T3 in the Y' axis direction. In the piezoelectric vibrating piece 130, the thickness T1 is thicker than the thickness T2 and the thickness T3, while the thickness T2 is thicker than the thickness T3. In the piezoelectric vibrating piece 130, for example, in the case where a frequency is 40 MHz, the thickness T2 is formed to be 41.75 μm.

Simulation Results of the Piezoelectric Vibrating Piece 130

In the case where the piezoelectric devices are mounted on printed circuit boards, simulations were performed to calculate stresses on the piezoelectric vibrating pieces when the printed circuit boards are bent. The simulations were performed assuming two cases: one case (long side bend) where the printed circuit board is bent in the long side direction (X axis direction) of the piezoelectric device 100, and the other case (short side bend) where the printed circuit boards are bent in the short side direction (Z' axis direction). The simulation results of the piezoelectric vibrating pieces will be described below.

Figure 4C:
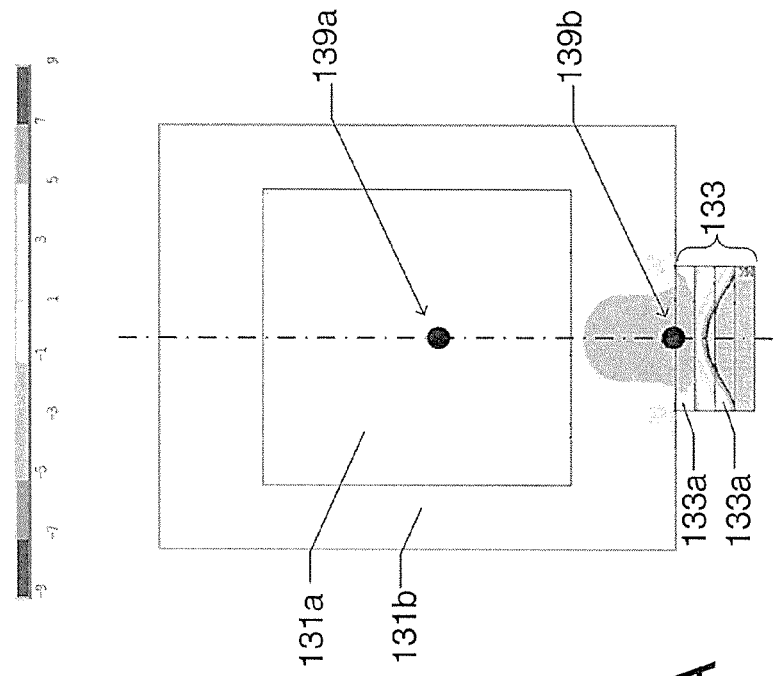
FIG. 4C is a simulation result of a short side bend of the piezoelectric vibrating piece 130.
Figure 4A:
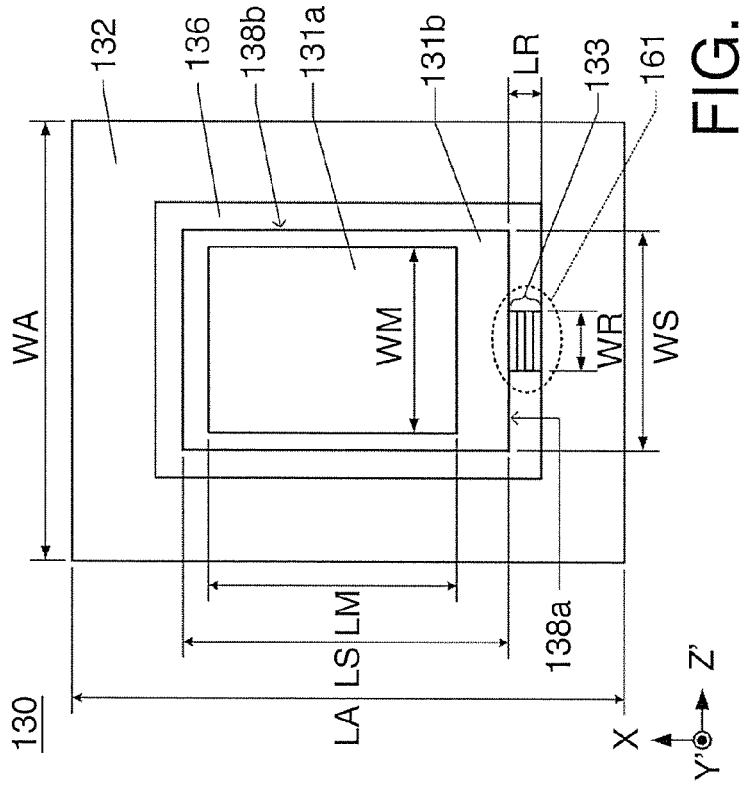
FIG. 4A is a plan view of the piezoelectric vibrating piece 130 without electrodes.

FIG. 4A is a plan view of the piezoelectric vibrating piece 130 without electrodes. Assume that in the piezoelectric vibrating piece 130, the framing portion 132 has a whole length WA in the Z' axis direction and a whole length LA in the X axis direction, the excitation unit 131 has the first side 138a with a length WS and the second side 138b with a length LS, the mesa region 131a has a length LM in the X axis direction and a length WM in the Z' axis direction, and the connecting portion 133 has a length WR in the Z' axis direction and a length LR in the X axis direction. The simulations were performed with the length LA of 2.0 mm, the length WA of 1.6 mm, the length LS of 1.3 mm, the length WS of 0.95 mm, the length LM of 0.78 mm, the length WM of 0.66 mm, the length LR of 0.2 mm, and the length WR of 0.32 mm.

Figure 4B:
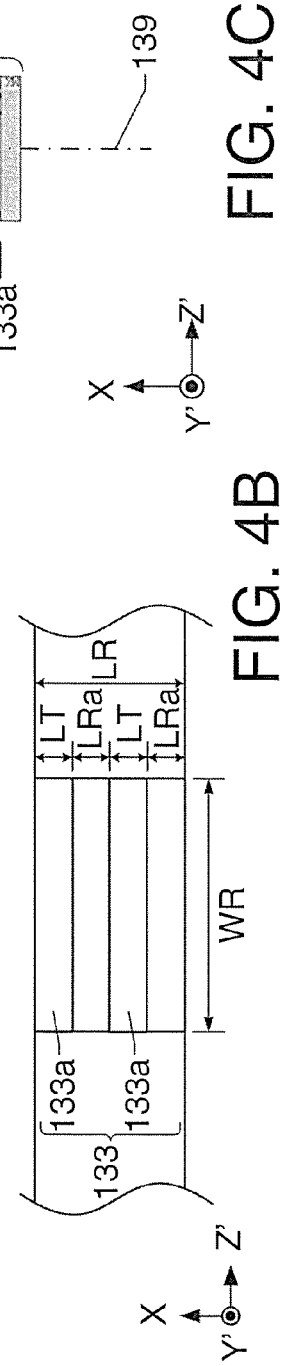
FIG. 4B is an enlarged plan view of a region enclosed by a dotted line 161 of FIG. 4A.

FIG. 4B is an enlarged plan view of a region enclosed by a dotted line 161 of FIG. 4A. Assume that the protrusions 133a have a length LT in the X axis direction, and the region where the protrusions 133a are not formed has a length LRa in the X axis direction. The piezoelectric vibrating piece 130 has lengths LT and LRa of 0.05 mm. The length of the protrusions 133a in the Z' axis direction is WR, which is the same length as the length of the connecting portion 133 in the Z' axis direction.

FIG. 4C is a simulation result of a short side bend of the piezoelectric vibrating piece 130. FIG. 4C illustrates a plan view of the excitation unit 131 and the connecting portion 133 in the piezoelectric vibrating piece 130 alone. FIG. 4C illustrates that the color in the mesa region 131a (white) indicates a portion almost free from stress. Portions with a color darker than the white are in a state where a stress is applied. Additionally, portions with a color close to black are in a state where the largest stress is applied. In FIG. 4C, the connecting portion 133 has a dark color. It is assumed that a large stress is applied to the connecting portion 133. From the connecting portion 133 toward the peripheral region 131b, the region with a thin color (grey region) is extended, indicating that the region where a stress is applied is extended from the connecting portion 133 to the peripheral region 131b.

Assume that the center point of the mesa region 131a is the center point 139a, a straight line parallel to the X axis and going through the center point 139a is a straight line 139, and a point on the straight line 139 and an end portion at the −X axis side of the excitation unit 131 is an end point 139b.

Figure 5A:
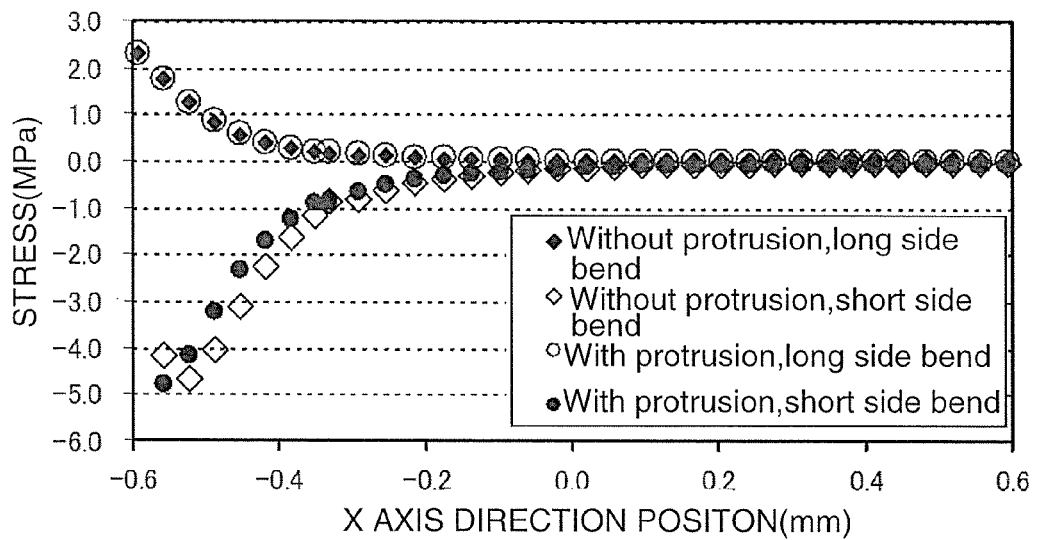
FIG. 5A is a graph illustrating stress distributions of an excitation unit 131.

FIG. 5A is a graph illustrating stress distributions of the excitation unit 131. FIG. 5A illustrates the stress distribution on the straight line 139 of FIG. 4C. The horizontal axis indicates an X axis direction position (mm). The vertical axis indicates a stress (MPa). Assume that the center point 139a (see FIG. 4C), which is the center point of the mesa region 131a, is 0.0 mm position in the X axis direction, a distance from the center point 139a to the +X axis direction is expressed as a positive value, and a distance from the center point 139a to the −X axis direction is expressed as a negative value. In the vertical axis, positive values indicate tensile stress, while negative values indicate compressive stress.

FIG. 5A illustrates results obtained from the following two cases: one case where the piezoelectric vibrating piece includes the protrusions 133a and the other case where the piezoelectric vibrating piece does not include the protrusions 133a. Each case describes two results obtained when the long side bend and the short side bend are performed. In FIG. 5A, the black diamond indicates the long side bend where the protrusions 133a are not formed, the white diamond indicates the short side bend where the protrusions 133a are not formed, the white circle indicates the long side bend where the protrusions 133a are formed, and the black circle indicates the short side bend where the protrusions 133a are formed.

In FIG. 5A, the long side bend where the protrusions are not formed (black diamond) and the long side bend where the protrusions are formed (white circle) have approximately the same values. Namely, in the case where the long side bend is performed, the presence or absence of the protrusions does not affect the stress values. On the other hand, for the short side bend where the protrusions are not formed (white diamond) and the short side bend where the protrusions are formed (black circle), the stress where the protrusions are formed is smaller than the stress where the protrusions are not formed within the range of approximately −0.5 mm to −0.2 mm position in the X axis direction.

Figure 5B:
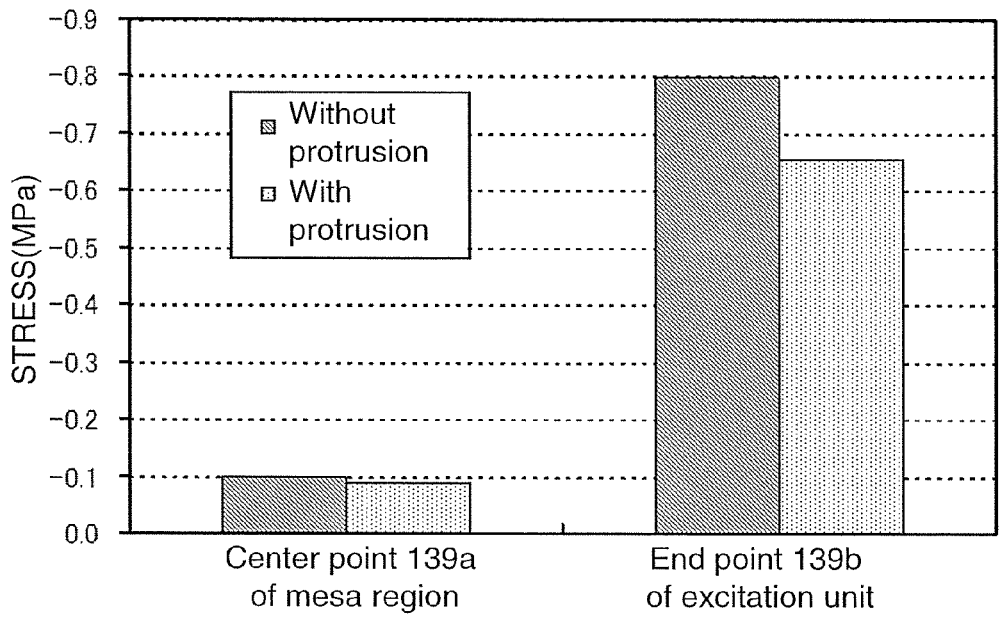
FIG. 5B is a graph illustrating the stresses of a center point 139a in the mesa region 131a and the end point 139b that is an end portion at the −X axis side of the excitation unit 131 in the case where the short side bend is performed.

FIG. 5B is a graph illustrating the stresses of the center point 139a in the mesa region 131a and the end point 139b, which is the end portion at the −X axis side of the excitation unit 131, in the case where the short side bend is performed. The center point 139a and the end point 139b are on the horizontal axis while the stress is on the vertical axis. FIG. 5B illustrates stresses in the respective points in the cases where the protrusions are formed and the protrusions are not formed. At the center point 139a of the mesa region 131a, the stress is −0.097 MPa in the case where the protrusions are not formed, and the stress is −0.090 MPa in the case where the protrusions are formed. At the end point 139b of the excitation unit 131, the stress value is −0.800 MPa in the case where the protrusions are not formed, and the stress value is −0.655 MPa in the case where the protrusions are formed. At the center point 139a of the mesa region 131a and the end point 139b of the excitation unit 131, the stress where the protrusions are formed is smaller than the stress where the protrusions are not formed. At the end point 139b of the excitation unit 131 where the protrusions are formed, the stress is reduced by 18% compared with the case where the protrusions are not formed.

The simulation demonstrated that the stress applied to the excitation unit 131 is reduced by the formation of the protrusions 133a in the connecting portion 133 of the piezoelectric vibrating piece 130. The strength of the connecting portion 133 is not reduced by forming protrusions. Accordingly, the formation of protrusions does not affect the impact resistance of the piezoelectric vibrating piece 130. Forming the protrusions 133a in the connecting portion 133 enables the excitation unit 131 to be less stressed without decreasing the impact resistance of the piezoelectric vibrating piece 130. This prevents the change in characteristics, such as the vibration frequency of a piezoelectric vibrating piece. Especially, since a connecting portion is generally the most vulnerable to the impact among the piezoelectric vibrating pieces, this is significantly effective.

Modification of the Piezoelectric Vibrating Piece 130

The protrusion in the connecting portion may be different from the protrusion 133a on the piezoelectric vibrating piece 130. Hereinafter, a description will be given of piezoelectric vibrating pieces 230 and 330 with a different protrusion from that of the piezoelectric vibrating piece 130. In the following description, like reference numerals designate corresponding or identical elements of the piezoelectric vibrating piece 130, and therefore such elements will not be further elaborated here.

Configuration of the Piezoelectric Vibrating Piece 230

Figure 6A:
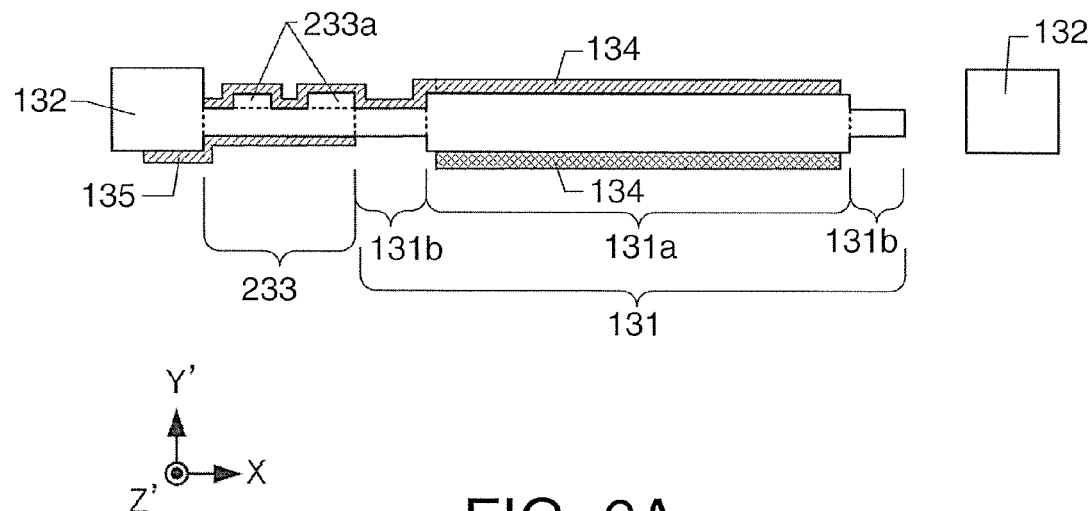
FIG. 6A is a cross-sectional view of a piezoelectric vibrating piece 230.

FIG. 6A is a cross-sectional view of the piezoelectric vibrating piece 230. The piezoelectric vibrating piece 230 includes the excitation unit 131, the framing portion 132 which surrounds the excitation unit 131, and a connecting portion 233 which connects the excitation unit 131 and the framing portion 132 together. The connecting portion 233 is, similarly to the connecting portion 133 of the piezoelectric vibrating piece 130, connected to the center of the first side 138a, which is the side at the −X axis side of the excitation unit 131. The connecting portions 233 each have the length LR in the X axis direction and the length WR in the Z' axis direction. The connecting portion 233 has a surface at the +Y' axis side where protrusions 233a are formed. The protrusions 233a are each formed in a similar shape to that of the protrusion 133a, which is formed on the surface at the +Y' axis side of the connecting portion 133. The protrusions 233a each have the length LT in the X axis direction and the length WR in the Z' axis direction. The piezoelectric vibrating piece 230 has the protrusion 233a only at the +Y' axis side of the connecting portion 133 while the surface at the −Y' axis side does not include the protrusion 233a.

Configuration of a Piezoelectric Vibrating Piece 330

Figure 6B:
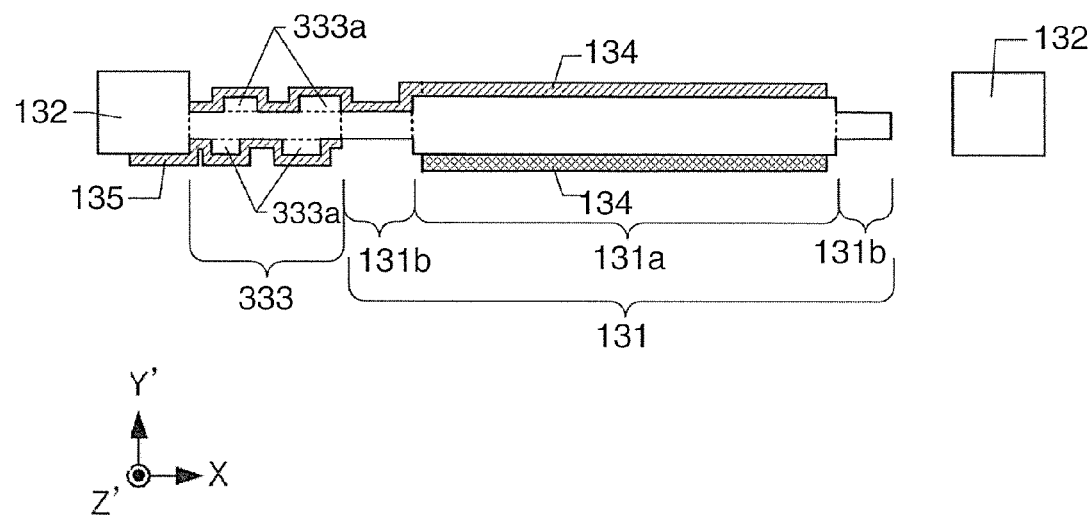
FIG. 6B is a cross-sectional view of a piezoelectric vibrating piece 330.

FIG. 6B is a cross-sectional view of a piezoelectric vibrating piece 330. The piezoelectric vibrating piece 330 includes the excitation unit 131, the framing portion 132 which surrounds the excitation unit 131, and a connecting portion 333 which connects the excitation unit 131 and the framing portion 132 together. The connecting portion 333 is, similarly to the connecting portion 133 of the piezoelectric vibrating piece 130, connected to the center of the first side 138a, which is the side at the −X axis side of the excitation unit 131. The connecting portion 333 has the length LR in the X axis direction and the length WR in the Z' axis direction. The connecting portion 333 has surfaces at the +Y' axis side and at the −Y' axis where protrusions 333a are formed. The protrusions 333a on the surface at the +Y' axis are formed in similar shapes and positions to those of the respective protrusions 133a, which are formed on the surface at the +Y' axis side of the connecting portion 133. The protrusions 333a each have the length LT in the X axis direction and the length WR in the Z' axis direction. The protrusions 333a on the surface at the −Y' axis side are each formed in a similar shape to that of the protrusion 333a on the surface at the +Y' axis side while their positions are shifted to the −X axis side with respect to the protrusion 333a on the surface at the +Y' axis side. That is, in the piezoelectric vibrating piece 330, the protrusions 333a on the surfaces at the +Y' axis side and the −Y' axis side are not mutually symmetrical.

The piezoelectric vibrating piece may include a protrusion, as shown in the piezoelectric vibrating piece 230, on one surface of the connecting portion only. As shown in the piezoelectric vibrating piece 330, the connecting portions on the surfaces at the +Y' axis side and at the −Y' axis side may include protrusions that are not mutually symmetrical in the Y' axis direction. While in the piezoelectric vibrating piece 130, the connecting portion 133 includes the two protrusions 133a on each of surfaces at the +Y' axis side and at the −Y' axis side, the number of protrusions may be one or larger than above. While in the piezoelectric vibrating piece 130 as illustrated in FIG. 3B, the mesa region 131a and the connecting portion 133 with the protrusions 133a have the same thickness, these members may have different thicknesses.

In contrast, in the case where a difference in level between the mesa region 131a and the peripheral region 131b has the same height as that of a difference in level between the connecting portion with the protrusions and the connecting portion without the protrusions while the peripheral region 131b and the connecting portion without the protrusions have the same thickness, this allows forming the protrusions and the mesa region 131a at the same time. This forms the piezoelectric vibrating piece 130 using a process similar to a process where the protrusions are not formed, and does not need an additional process only for forming the protrusions, which is preferred.

Second Embodiment

The piezoelectric vibrating piece may include the protrusions in a region between the connecting portion and the excitation electrode. Hereinafter, a description will be given of the piezoelectric vibrating piece where the protrusions are formed in the region between the connecting portion and the excitation electrode. In the following description, like reference numerals designate corresponding or identical elements in the first embodiment, and therefore such elements will not be further elaborated here.

Configuration of a Piezoelectric Vibrating Piece 430

FIG. 7A is a plan view of a piezoelectric vibrating piece 430 without electrodes. The piezoelectric vibrating piece 430 includes an excitation unit 431, the framing portion 132 which surrounds the excitation unit 431, a connecting portion 433 which connects the excitation unit 431 and the framing portion 132 together. The connecting portion 433 is connected to the center of the first side 138a, which is the side at the −X axis side of the excitation unit 431. While electrodes are not illustrated in FIG. 7A, the piezoelectric vibrating piece 430 includes the excitation electrode 134 and the extraction electrode 135 (see FIG. 3A), similarly to the piezoelectric vibrating piece 130. The excitation unit 431, the framing portion 132, and the connecting portion 433 each have a similar dimension to that in the piezoelectric vibrating piece 130 described in FIG. 4A. The excitation unit 431 includes the mesa region 131a with the excitation electrode 134, and a peripheral region 431b, which is formed around the mesa region 131a. The peripheral region 431b includes protrusions 433a in a region between the mesa region 131a and the connecting portion 433. The peripheral region 431b includes a surface at the +Y' axis side where two protrusions 433a are aligned in the X axis direction. The protrusion 433a at the +X axis side has an end potion at the −Z' axis side where the side of the end portion is aligned with the side of the connecting portion 433 at the −Z' axis side in the X axis direction. The protrusion 433a at the −X axis side has an end portion at the +Z' axis side where the side of the end portion is aligned with the side of the connecting portion 433 at the +Z' axis side in the X axis direction. The protrusions 433a in the peripheral region 431b are formed on the respective surfaces in the peripheral region 431b at the +Y' axis side and the −Y' axis side. The protrusions 433a at the +Y' axis side and the protrusions 433a at the −Y' axis side are mutually symmetrical in the Y' axis direction. Additionally, the protrusions 433a each have the length LT in the X axis direction and a length WT in the Z' axis direction. The length WT is longer than the length WR of the connecting portion 433 in the Z' axis direction, and its length is 0.465 mm.

FIG. 7B is a simulation result of the short side bend of the piezoelectric vibrating piece 430. FIG. 7B illustrates a plan view of the excitation unit 431 and the connecting portion 433 in the piezoelectric vibrating piece 430. In FIG. 7B, the connecting portion 433 has a darker color. It is assumed that a large stress is applied to the connecting portion 433. From the connecting portion 433 toward the peripheral region 431b, the region with a thin color (grey region) is extended, indicating that the region where a stress is applied is extended from the connecting portion 433 to the peripheral region 431b. The stressed region undergoes a large stress at the −X axis side of the protrusion 433a, while the stressed region is not observed at the +X axis side of the protrusion 433a. Accordingly, the stress at the +X axis side of the protrusion 433a is considerably smaller than the stress on the connecting portion 433. Assume that the center point of the mesa region 131a is the center point 439a, a straight line parallel to the X axis and going through the center point 439a is a straight line 439, and a point on the straight line 439 and an end portion at the −X axis side of the excitation unit 431 is an end point 439b.

Figure 8A:
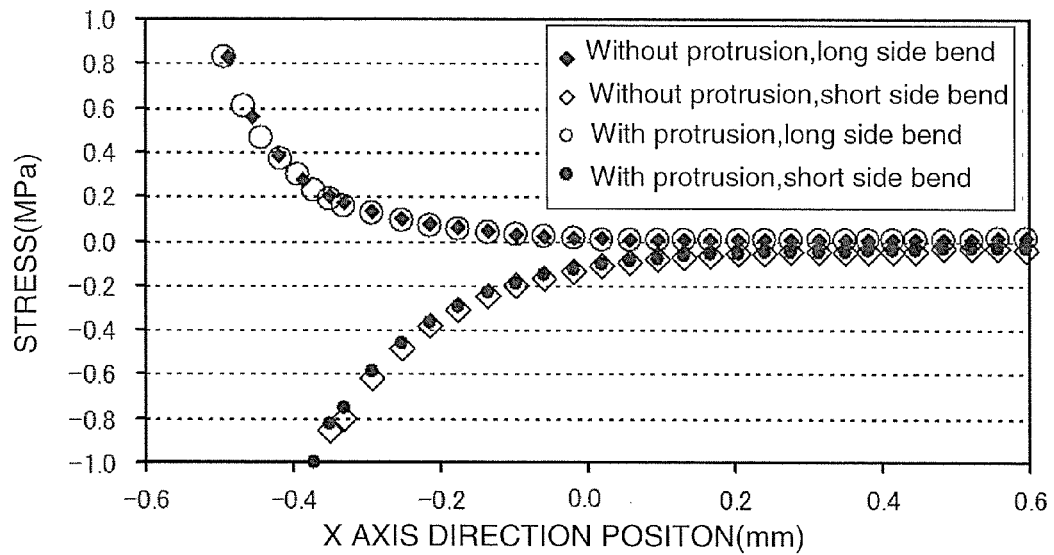
FIG. 8A is a graph illustrating stress distributions of an excitation unit 431.

FIG. 8A is a graph illustrating stress distributions of the excitation unit 431. FIG. 8A illustrates the stress distribution on the straight line 439 of FIG. 7B. The horizontal axis indicates an X axis direction position (mm). The vertical axis indicates a stress (MPa). Assume that the center point 439a, which is the center point of the mesa region 131a (see FIG. 7B), is 0.0 mm position in the X axis direction. A distance from the center point 439a to the +X axis direction is expressed as a positive value. A distance from the center point 439a to the −X axis direction is expressed as a negative value. In the vertical axis, positive values indicate tensile stress, while negative values indicate compressive stress. FIG. 8A illustrates results obtained from the following two cases: one case where the protrusions 433a are formed and the other case where the protrusions 433a are not formed. Each case describes two results obtained when the long side bend and the short side bend are performed. In FIG. 8A, the black diamond indicates the long side bend where the protrusions 433a are not formed. The white diamond indicates the short side bend where the protrusions 433a are not formed. The white circle indicates the long side bend where the protrusions 433a are formed. The black circle indicates the short side bend where the protrusions 433a are formed.

In FIG. 8A, the values of the long side bend where the protrusions 433a are not formed (black diamond) and the long side bend where the protrusions 433a are formed (white circle) are approximately the same. Additionally, variation tendencies of the stress at the positions in the X axis direction are approximately the same. On the other hand, for the short side bend where the protrusions 433a are not formed (white diamond) and the short side bend where the protrusions 433a are formed (black circle), the stress where the protrusions 433a are formed has a slightly smaller absolute value than that of the stress where the protrusions 433a are not formed within the range of approximately −0.4 mm to −0.1 mm position in the X axis direction.

Figure 8B:
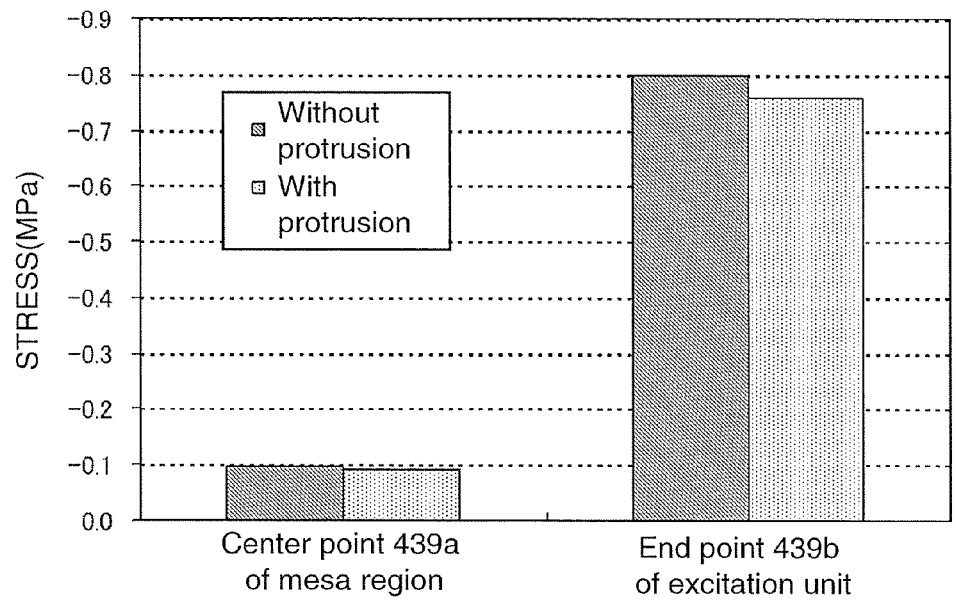
FIG. 8B is a graph illustrating the stresses of the center point 439a in a mesa region 131a and an end point 439b that is an end portion at the −X axis side of the excitation unit 431 in the case where a short side bend is performed.

FIG. 8B is a graph illustrating the stresses of the center point 439a in the mesa region 131a and the end point 439b at the −X axis side of the excitation unit 431 in the case where the short side bend is performed. The center point 439a and the end point 439b are on the horizontal axis while the stress is on the vertical axis. FIG. 8B illustrates stresses in the respective points in the cases where the protrusions 433a are formed and the protrusions 433a are not formed. At the center point 439a of the mesa region 131a, the stress is −0.097 MPa in the case where the protrusions 433a are not formed, and the stress is −0.093 MPa in the case where the protrusions 433a are formed. At the end point 439b of the excitation unit 431, the stress value is −0.800 MPa in the case where the protrusions 433a are not formed, and the stress value is −0.758 MPa in the case where the protrusions 433a are formed. At the center point 439a of the mesa region 131a and the end point 439b of the excitation unit 431, the stress where the protrusions 433a are formed is smaller than the stress where the protrusions 433a are not formed. At the end point 439b of the excitation unit 431 where the protrusions 433a are formed, the stress is reduced by about 5% compared with the case where the protrusions 433a are not formed.

The simulation demonstrated that stress applied to the excitation unit 431 is reduced by the formation of the protrusions 433a also in the piezoelectric vibrating piece 430. Accordingly, in the piezoelectric vibrating piece 430, the formation of protrusions 433a reduces the stress on the excitation unit 431 without degrading the impact resistance. This prevents the change in characteristics, such as the vibration frequency of the piezoelectric vibrating piece 430. Even in the case where the piezoelectric vibrating piece 430 includes the protrusion 433a that has a length shorter than the length WR of the connecting portion 433 in the Z' axis direction, the piezoelectric vibrating piece 430 is considered to reduce the stress transferring from the connecting portion 433 to the mesa region 131a. However, as illustrated in FIG. 7B, the whole connecting portion 433 undergoes the stress. In order to prevent the stress on the whole connecting portion 433 from transferring to the mesa region 131a, it is preferred that the length of the protrusion 433a in the Z' axis direction be equal to or longer than that of the connecting portion 433 in the Z' axis direction.

Modification of the Piezoelectric Vibrating Piece 430

The protrusion in the peripheral region may be different from the protrusion 433a in the piezoelectric vibrating piece 430. Hereinafter, a description will be given of piezoelectric vibrating piece 530 with a protrusion that is different from that of the piezoelectric vibrating piece 430. In the following description, like reference numerals designate corresponding or identical elements of the piezoelectric vibrating piece 130 or 430, and therefore such elements will not be further elaborated here.

Configuration of the Piezoelectric Vibrating Piece 530

Figures 9A, 9B:
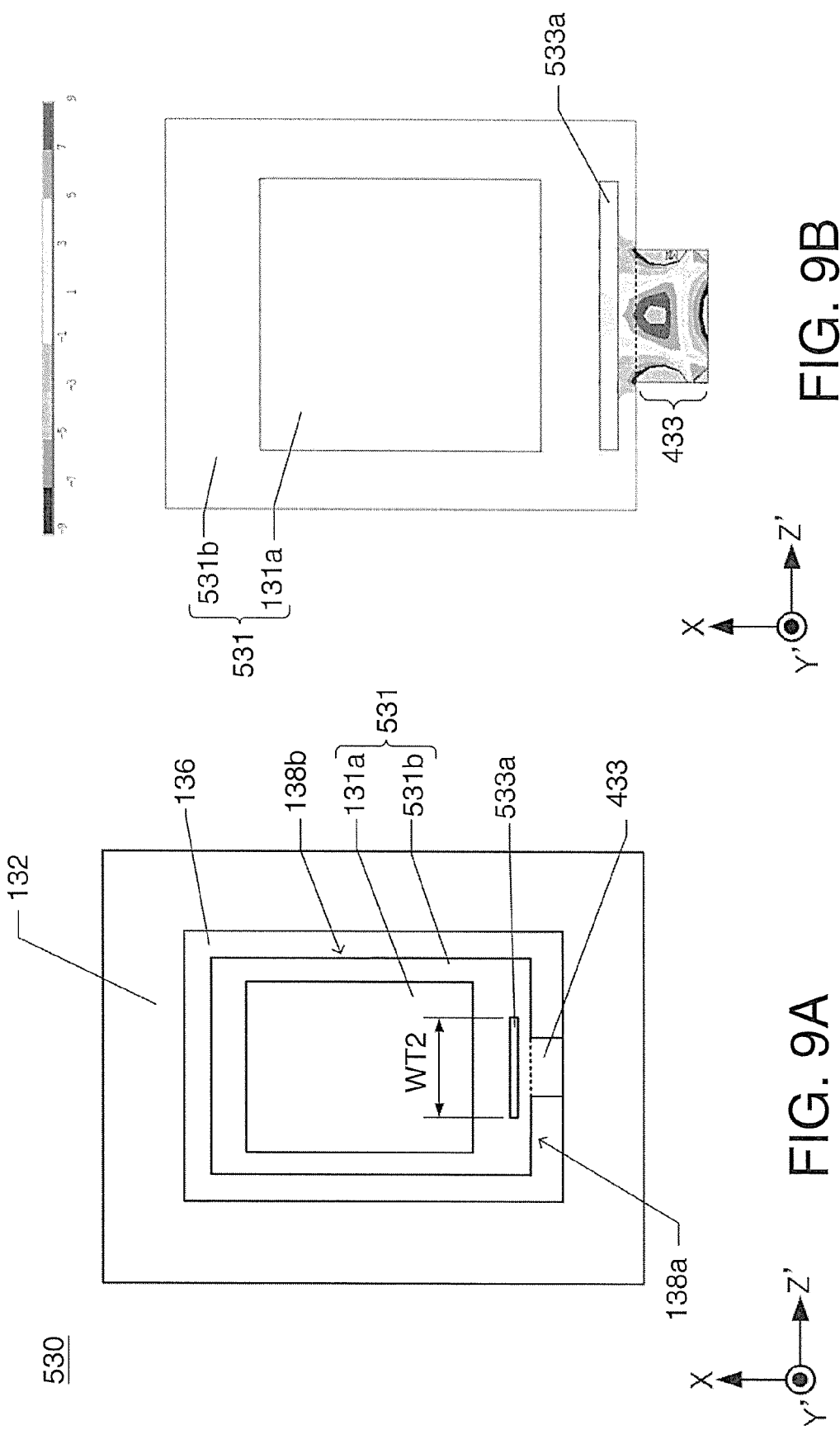
FIG. 9A is a plan view of a piezoelectric vibrating piece 530 without electrodes.
FIG. 9B is a simulation result of a short side bend of the piezoelectric vibrating piece 530.

FIG. 9A is a plan view of the piezoelectric vibrating piece 530 without electrodes. The piezoelectric vibrating piece 530 includes an excitation unit 531, the connecting portion 433, and the framing portion 132. The excitation unit 531 includes the mesa region 131a with the excitation electrode 134 and a peripheral region 531b, which is formed around the mesa region 131a. The peripheral region 531b between the mesa region 131a and the connecting portion 433 includes protrusions 533a on its respective surfaces at the +Y' axis side and the –Y' axis side. The protrusions 533a are formed on the respective surfaces of the peripheral region 531b at the +Y' axis side and the –Y' axis side one by one. The protrusion 533a on the surface at the +Y' axis side and the protrusion 533a on the surface at the –Y' axis side are mutually symmetrical in the Y' axis direction. The protrusions 533a each have the length LT in the X axis direction and the length WT2 in the Z' axis direction. The piezoelectric vibrating piece 530 has the length WT2 of 0.65 mm. The center of the connecting portion 433 and the centers of the respective protrusions 533a are on a straight line extending in the X axis direction.

FIG. 9B is a simulation result of the short side bend of the piezoelectric vibrating piece 530. FIG. 9B illustrates a plan view of the excitation unit 531 and the connecting portion 433 in the piezoelectric vibrating piece 530. FIG. 9B illustrates, similarly to FIG. 7B, that the region where the stress is applied is extended from the connecting portion 433 to the peripheral region 53 1b. The stressed region is not observed at the +X axis side with respect to the protrusion 533a. The stress on the protrusion 533a at the +X axis side is considerably smaller than the stress on the connecting portion 433. FIG. 9B shows that even one protrusion reduces the stress from the connecting portion.

Third Embodiment

The connecting portion in the piezoelectric vibrating piece may be connected to various portions of the excitation unit. Hereinafter, a description will be given of a typical piezoelectric vibrating piece where connecting portions are connected to the excitation unit on both ends of the first side. In the following description, like reference numerals designate corresponding or identical elements in the first embodiment, and therefore such elements will not be further elaborated here.

Configuration of a Piezoelectric Vibrating Piece 630

FIG. 10A is a plan view of the piezoelectric vibrating piece 630 without electrodes. The piezoelectric vibrating piece 630 includes the excitation unit 131, the framing portion 132, and connecting portions 633. The connecting portions 633 are connected to both ends of the first side 138a of the excitation unit 131 at the –X axis side. A region, which is other than the connecting portion 633, between the excitation unit 131 and the framing portion 132 forms a through hole 636 that passes through the piezoelectric vibrating piece 630 in the Y' axis direction. On the respective surfaces of the connecting portions 633 at +Y' axis side and the –Y' axis side in the piezoelectric vibrating piece 630, the protrusions 633a are formed one by one. The protrusion 633a on the surface at the +Y' axis side and the protrusion 633a on the surface at the –Y' axis side are mutually symmetrical in the Y' axis direction. The protrusion 633a each have the same length in the Z' axis direction as that of the connecting portion 633 in the Z' axis direction.

Configuration of a Piezoelectric Vibrating Piece 730

FIG. 10B is a plan view of a piezoelectric vibrating piece 730 without electrodes. The piezoelectric vibrating piece 730 includes an excitation unit 731, the framing portion 132, and connecting portions 733. The excitation unit 731 includes the mesa region 131a with the excitation electrode 134, and a peripheral region 731b around the mesa region 131a. The connecting portions 733 are connected to both ends of the first side 138a, which is the side at the –X axis side of the excitation unit 731. On the respective surfaces of the peripheral region 731b at the +Y' axis side and the –Y' axis side between the mesa region 131a and the connecting portions 733, protrusions 733a are formed. The protrusions 733a are longer in the Z' axis direction than the respective connecting portion 733. The protrusion 733a on the surface at the +Y' axis side and the protrusion 733a on the surface at the –Y' axis side are mutually symmetrical in the Y' axis direction.

The protrusion may be formed in a piezoelectric vibrating piece where two connecting portions are connected to the excitation unit, as described in the piezoelectric vibrating piece 630 and the piezoelectric vibrating piece 730. The protrusion may be formed, for example, in a piezoelectric vibrating piece where the connecting portion is connected to one end potion of the first side 138a only, or in a piezoelectric vibrating piece where the connecting portions are connected to the respective end portions of the excitation unit at the +X axis side and the –X axis side so as to support the piezoelectric vibrating piece with both the end portions.

Configuration of a Piezoelectric Device 1100 According to a Fourth Embodiment

Figure 11:
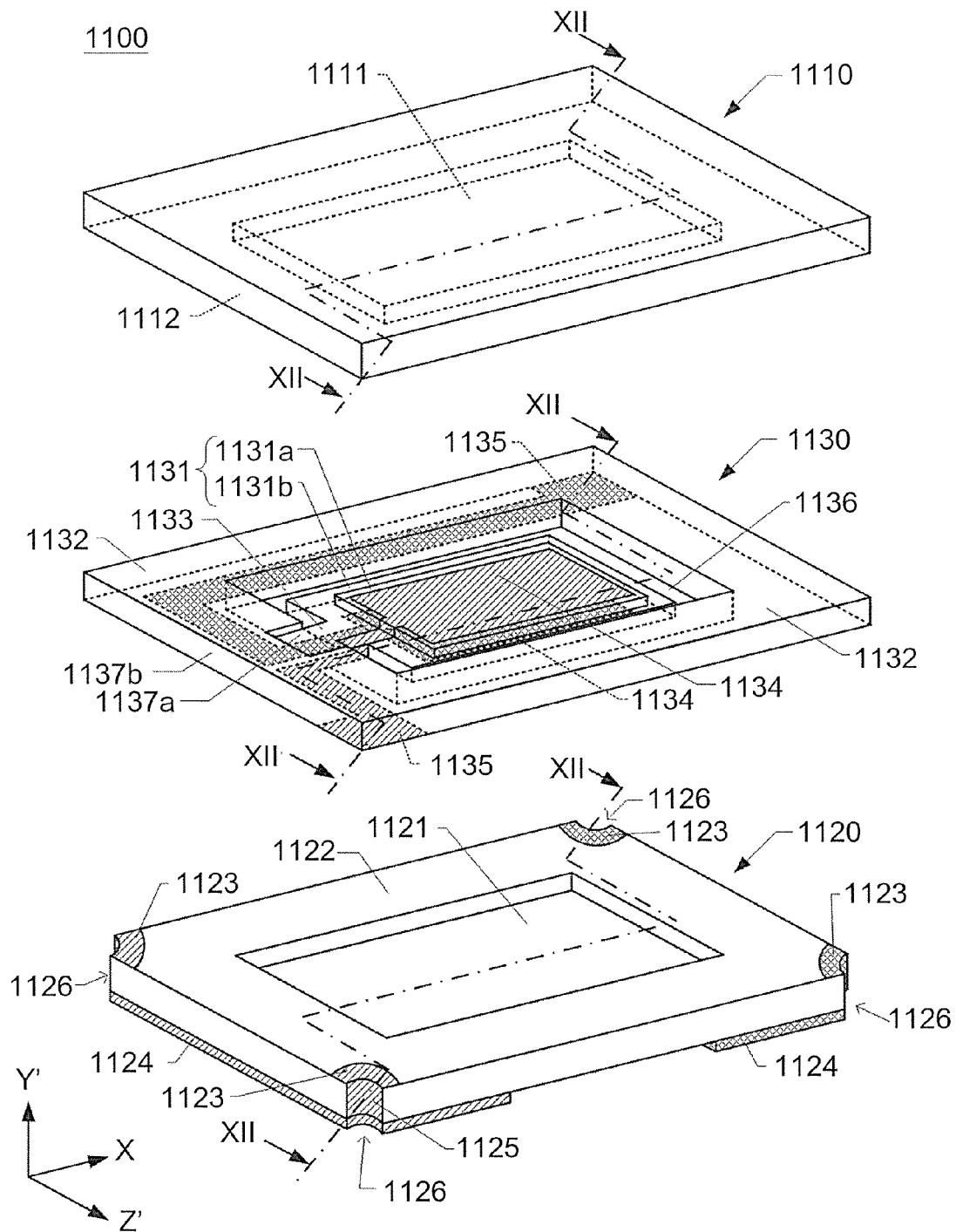
FIG. 11 is an exploded perspective view of a piezoelectric device 1100.

FIG. 11 is an exploded perspective view of a piezoelectric device 1100. The piezoelectric device 1100 includes a lid plate 1110, a base plate 1120, and a piezoelectric vibrating piece 1130. The piezoelectric vibrating piece 1130 employs, for example, an AT-cut quartz-crystal vibrating piece. The AT-cut quartz-crystal vibrating piece has a principal surface (in the YZ plane) that is tilted by 35° 15' about the Y-axis of the crystallographic axis (XYZ) in the direction from the Z-axis to the Y-axis around the X-axis. In the following description, the new axes tilted with reference to the axis directions of the AT-cut quartz-crystal vibrating piece are denoted as the Y' axis and the Z' axis. Therefore, in the piezoelectric device 1100, the longitudinal direction of the piezoelectric device 1100 is referred to as the X axis direction, the height direction of the piezoelectric device 1100 is referred to as the Y' axis direction, and the direction perpendicular to the X axis and the Y' axis directions is referred to as the Z' axis direction.

The piezoelectric vibrating piece 1130 includes an excitation unit 1131 which is formed in a rectangular shape and vibrates at a predetermined frequency, a framing portion 1132 which surrounds the excitation unit 1131, and one connecting portion 1133 which connects the excitation unit 1131 and the framing portion 1132 together. A region, which is other than the connecting portion 1133, between the excitation unit 1131 and the framing portion 1132 forms a through hole 1136 that passes through the piezoelectric vibrating piece 1130 in the Y' axis direction. The excitation unit 1131 includes the excitation electrodes 1134 on its surfaces at the +Y' axis side and −Y' axis side. The excitation unit 1131 includes a mesa region 1131a with the excitation electrodes 1134 and a peripheral region 1131b, which is formed around the mesa region 1131a and is thinner in the Y' axis direction than the mesa region 1131a. From the excitation electrodes 1134 on the surface at the +Y' axis side and the surface at the −Y' axis side, respective extraction electrodes 1135 are extracted through the connecting portion 1133 to the surface at the −Y' axis side of the framing portion 1132. Additionally, the framing portion 1132 has a first region 1137a and a second region 1137b. The first region 1137a has the same thickness in the Y' axis direction as that of the connecting portion 1133. The second region 1137b is thicker than the first region 1137a in the Y' axis direction. The connecting portion 1133 is connected to a region that includes the first region 1137a in the framing portion 1132.

The base plate 1120 is disposed at the −Y' axis side of the piezoelectric vibrating piece 1130. The base plate 1120 is formed in a rectangular shape that has long sides in the X axis direction and short sides in the Z' axis direction. The base plate 1120 includes a pair of external electrodes 1124 on the surface at the −Y' axis side. The external electrodes 1124 are secured and electrically connected to a printed circuit board or a similar member via solder. This mounts the piezoelectric device 1100 on the printed circuit board or a similar member. On side surfaces at four corners of the base plate 1120, castellations 1126 are formed while castellation electrodes 1125 are formed on the castellations 1126. The base plate 1120 includes a recess 1121 on the surface at the +Y' axis side while a bonding surface 1122 is formed in a peripheral area of the recess 1121. The bonding surface 1122 includes connecting electrodes 1123 in peripheral areas of the castellations 1126 at the four corners. The connecting electrodes 1123 are electrically connected to the external electrodes 1124 via the castellation electrodes 1125 on the castellation 1126. The base plate 1120 is bonded to the surface of the framing portion 1132 at the −Y' axis side in the piezoelectric vibrating piece 1130 via a sealing material 1141 (see FIG. 12) on the bonding surface 1122. The connecting electrodes 1123 are electrically connected to the extraction electrodes 1135 of the piezoelectric vibrating piece 1130.

The lid plate 1110 is disposed at the +Y' axis side of the piezoelectric vibrating piece 1130. The lid plate 1110 includes a recess 1111 on its surface at the −Y' axis side, while a bonding surface 1112 is formed in a peripheral area of the recess 1111. The lid plate 1110 is bonded to the surface of the framing portion 1132 at the +Y' axis side in the piezoelectric vibrating piece 1130 via the sealing material 1141 (see FIG. 12) on the bonding surface 1112.

Figure 12:
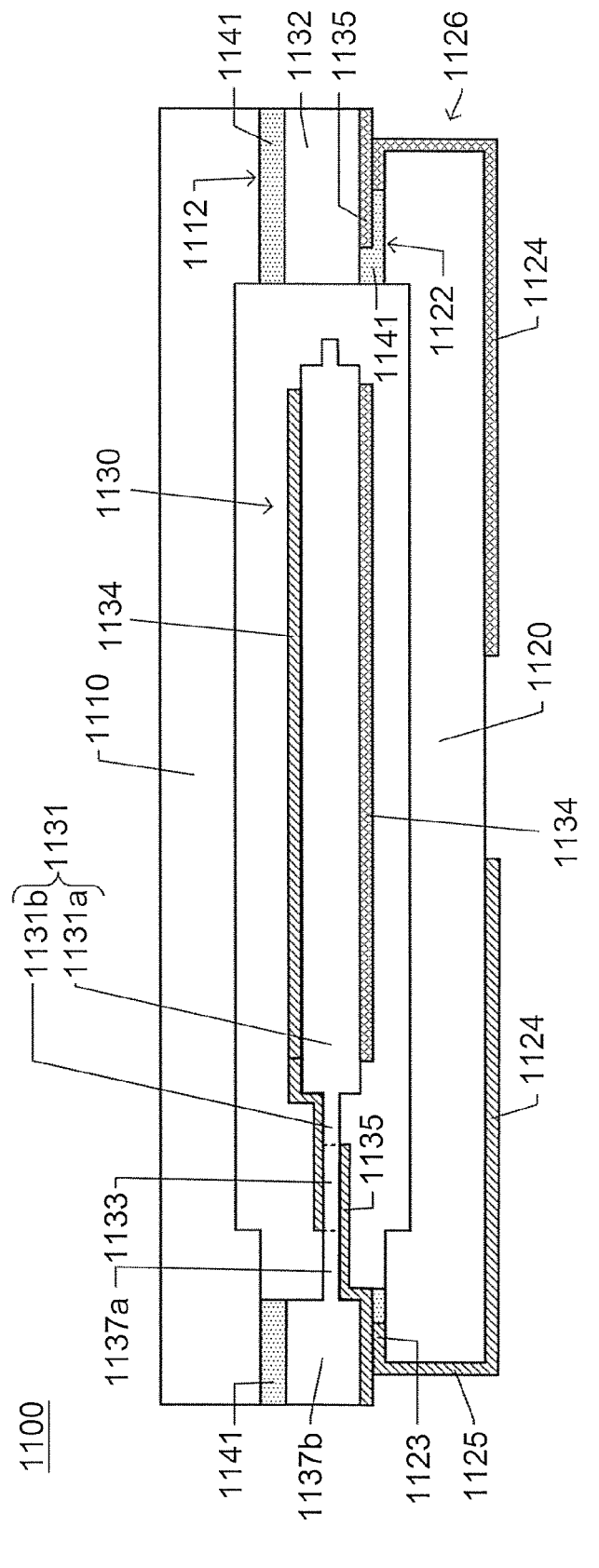
FIG. 12 is a cross-sectional view taken along the line XII-XII of FIG. 11.

FIG. 12 is a cross-sectional view taken along the line XII-XII of FIG. 11. The piezoelectric device 1100 includes the piezoelectric vibrating piece 1130 with the framing portion 1132. On the surface at the +Y' axis side of the framing portion 1132, the bonding surface 1112 of the lid plate 1110 is bonded with the sealing material 1141. On the surface at the −Y' axis side of the framing portion 1132, the bonding surface 1122 of the base plate 1120 is bonded with the sealing material 1141. This configuration hermetically seals the inside of the piezoelectric device 1100. When the piezoelectric vibrating piece 1130 and the base plate 1120 are bonded together, the extraction electrodes 1135, which are formed on the surface of the framing portion 1132 at the −Y' axis side, and the connecting electrodes 1123, which are formed on the bonding surface 1122 of the base plate 1120, are electrically connected together. Thus, the respective excitation electrodes 1134, which are formed on the +Y' axis side and the −Y' axis side of the mesa region 1131a, are electrically connected to the external electrodes 1124 via the extraction electrode 1135, the connecting electrode 1123, and the castellation electrode 1125.

Figure 13A:
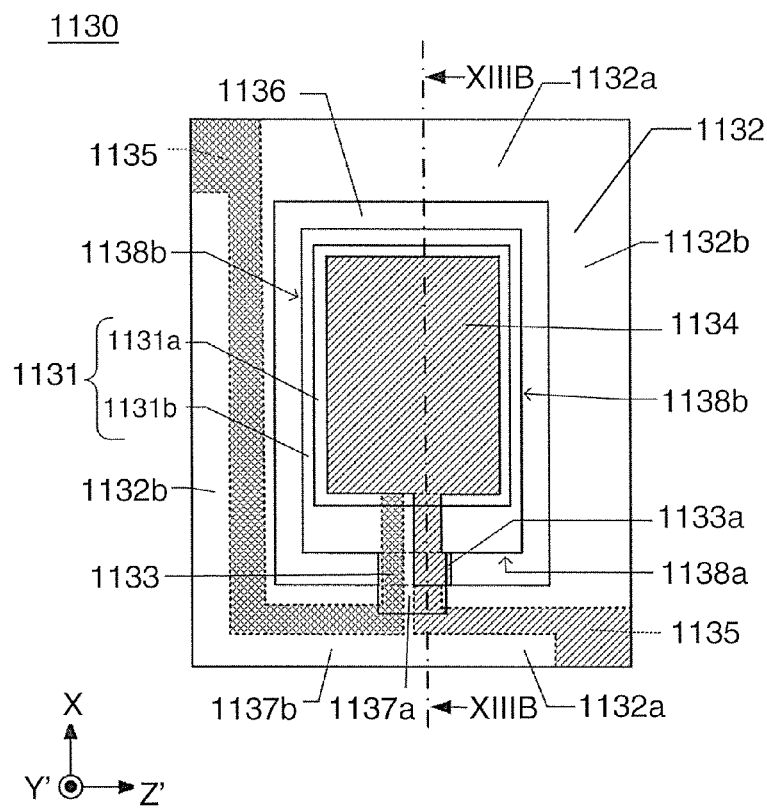
FIG. 13A is a plan view of a piezoelectric vibrating piece 1130.

FIG. 13A is a plan view of the piezoelectric vibrating piece 1130. The piezoelectric vibrating piece 1130 includes the excitation unit 1131 in a rectangular shape, the framing portion 1132 which surrounds the excitation unit 1131, and one connecting portion 1133 which connects the excitation unit 1131 and the framing portion 1132 together. The excitation unit 1131 includes a first side 1138a, which is the side of the excitation unit 1131 at the −X axis side, and second sides 1138b, which are sides of the excitation unit 1131 at the +Z' axis side and the −Z' axis side. The framing portion 1132 includes a first framing body 1132a, which extends in the Z' axis direction, and a second framing body 1132b, which extends in the X axis direction, so as to surround the excitation unit 1131. The excitation unit 1131 includes the first framing body 1132a at the −X axis side where a first region 1137a and a second region 1137b are disposed. The first region 1137a has the same thickness in the Y' axis direction as that of the connecting portion 1133. The second region 1137b is thicker than the first region 1137a in the Y' axis direction. The connecting portion 1133 is connected to a region that includes the first region 1137a in the framing portion 1132. The connecting portion 1133 is also connected to the center of the first side 1138a in the excitation unit 1131. A region, which is other than the connecting portion 1133, between the excitation unit 1131 and the framing portion 1132 forms the through hole 1136 that passes through the piezoelectric vibrating piece 1130 in the Y' axis direction. The excitation unit 1131 has the peripheral region 1131b that surrounds the mesa region 1131a. From the excitation electrode 1134 on the surface at the +Y' axis side of the mesa region 1131a, the extraction electrodes 1135 are extracted via the peripheral region 1131b, the surface at the +Y' axis side of the connecting portion 1133, the side surface 1133a at the +Z' axis side of the connecting portion 1133, and the surface at the −Y' axis side of the connecting portion 1133 to the corner portion at the +Z' axis side and −X axis side on the surface at the −Y' axis side of the framing portion 1132. From the excitation electrode 1134 (see FIG. 13B) on the surface at the −Y' axis side of the mesa region 1131a, the extraction electrode 1135 is extracted via the surfaces at the −Y' axis sides of the peripheral region 1131b and the connecting portion 1133 to the framing portion 1132. The extraction electrode 1135 further extends on the surface at the −Y' axis side of the framing portion 1132 in the −Z' axis direction and the +X axis direction. The extraction electrode 1135 is extracted to the corner portion at the +X axis side and −Z' axis side on the surface at the −Y' axis side of the framing portion 1132.

Figure 13B:
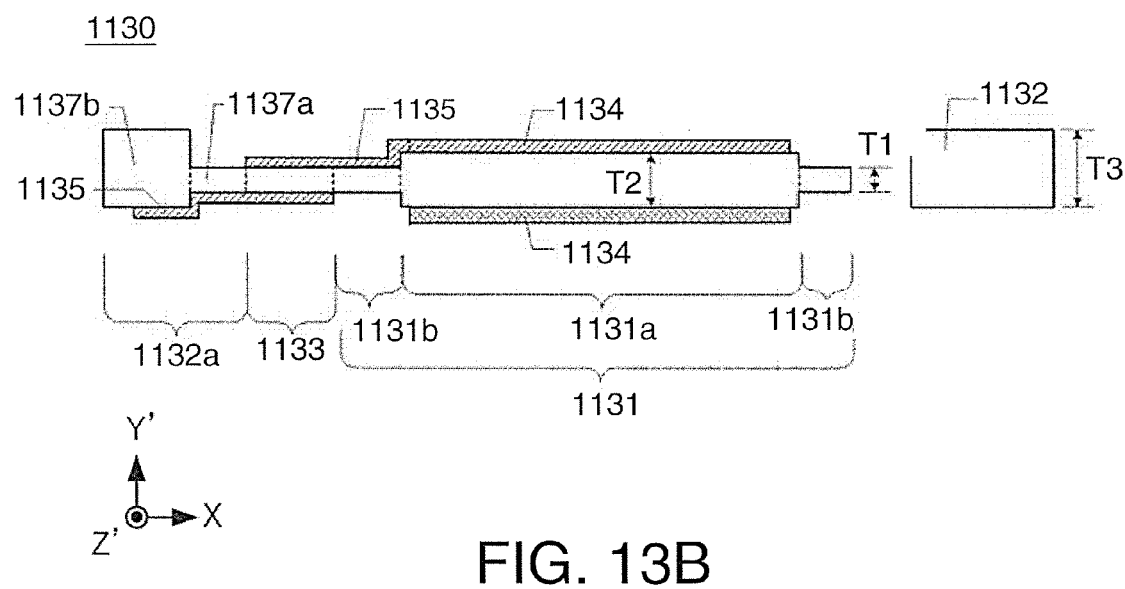
FIG. 13B is a cross-sectional view taken along the line XIIIB-XIIIB of FIG. 13A.

FIG. 13B is a cross-sectional view taken along the line XIIIB-XIIIB of FIG. 13A. Assume that in the piezoelectric vibrating piece 1130, the framing portion 1132 other than the first region 1137a has a third thickness T3 in the Y' axis direction, the mesa region 1131a has a second thickness T2 in the Y' axis direction, and the peripheral region 1131b, the connecting portion 1133 and the first region 1137a of the framing portion 1132 have a first thickness T1 in the Y' axis direction. In the piezoelectric vibrating piece 1130, the third thickness T3 is thicker than the second thickness T2 and the first thickness T1, while the second thickness T2 is thicker than the first thickness T1. In the piezoelectric vibrating piece 1130, for example, in the case where a frequency is 40 MHz, the second thickness T2 is formed to 41.75 μm.

Simulation Results of the Piezoelectric Vibrating Piece 1130

In the case where the piezoelectric devices 1100 are mounted on printed circuit boards, simulations were performed to calculate stresses on the piezoelectric vibrating pieces 1130 when the printed circuit boards are bent. The simulations were performed assuming two cases: one case (long side bend) where the printed circuit board is bent in the long side direction (X axis direction) of the piezoelectric device 1100, and the other case (short side bend) where the printed circuit board is bent in the short side direction (Z' axis direction). The simulation results of the piezoelectric vibrating pieces 1130 will be described below.

FIG. 14A is a plan view of the piezoelectric vibrating piece 1130 without electrodes. Assume that in the piezoelectric vibrating piece 1130, the framing portion 1132 has a whole length WA in the Z' axis direction and a whole length LA in the X axis direction, the first framing body 1132a has a length LC in the X axis direction, the excitation unit 1131 has the first side 1138a with a length WS and the second side 1138b with a length LS, the mesa region 1131a has a length LM in the X axis direction and a length WM in the Z' axis direction, the connecting portion 1133 has a length WR in the Z' axis direction and a length LR in the X axis direction, and the first region 1137a of the framing portion 1132 has a length LB in the X axis direction. The simulations were performed with the length LA of 2.0 mm, the length WA of 1.6 mm, the length LC of 0.2 mm, the length LS of 1.3 mm, the length WS of 0.95 mm, the length LM of 0.78 mm, the length WM of 0.66 mm, the length LR of 0.1 mm, the length WR of 0.32 mm, and the length LB of 0.1 mm.

FIG. 14B is the simulation result of the short side bend of the piezoelectric vibrating piece 1130. FIG. 14B illustrates a plan view of the excitation unit 1131 and the connecting portion 1133 in the piezoelectric vibrating piece 1130 alone. FIG. 14B illustrates that the color in the mesa region 1131a (white) indicates a portion almost free from stress. Portions with a color darker than the white are in a state where a stress is applied. Additionally, portions with a color close to black are in a state where the largest stress is applied. In FIG. 14B, the connecting portion 1133 and its peripheral region have dark colors. It is assumed that a stress is applied to the connecting portion 1133 and its peripheral region. Assume that the center point of the mesa region 1131a is a center point 1139a, a straight line parallel to the X axis and going through the center point 1139a is a straight line 1139, and a point on the straight line 1139 and an end portion at the −X axis side of the excitation unit 1131 is an end point 1139b.

Figure 15A:
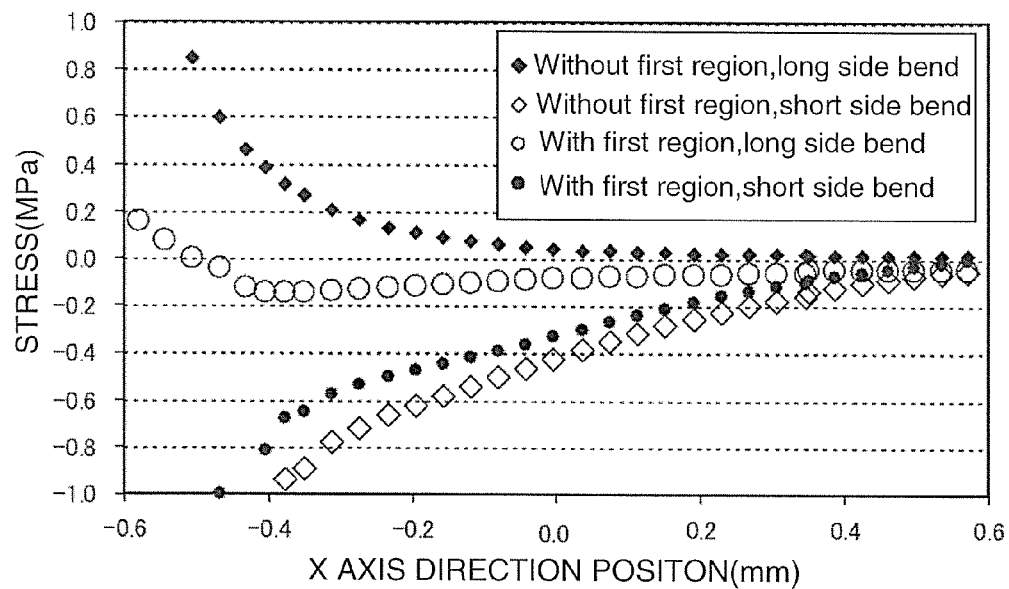
FIG. 15A is a graph illustrating stress distributions of an excitation unit 1131.

FIG. 15A is a graph illustrating stress distributions of the excitation unit 1131. FIG. 15A illustrates the stress distribution on the straight line 1139 of FIG. 14B. The horizontal axis indicates an X axis direction position (mm). The vertical axis indicates a stress (MPa). Assume that the center point 1139a, which is the center point of the mesa region 1131a (see FIG. 14B), is 0.0 mm position in the X axis direction. A distance from the center point 1139a to the +X axis direction is expressed as a positive value. A distance from the center point 1139a to the −X axis direction is expressed as a negative value. In the vertical axis, positive values indicate tensile stress, while negative values indicate compressive stress. FIG. 15A illustrates results obtained from the following two cases: one case where the piezoelectric vibrating piece 1130 includes the first region 1137a, and the other case where the piezoelectric vibrating piece 1130 does not include the first region 1137a. Each case describes two results obtained when the long side bend and the short side bend are performed. In FIG. 15A, the black diamond indicates the long side bend where the first region 1137a is not formed, the white diamond indicates the short side bend where the first region 1137a is not formed, the white circle indicates the long side bend where the first region 1137a is formed, and the black circle indicates the short side bend where the first region 1137a is formed.

FIG. 15A illustrates the long side bend where the first region 1137a is not formed (black diamond) and the long side bend where the first region 1137a is formed (white circle) as follows. The long side bend where the first region 1137a is formed has a smaller absolute stress value than that of the long side bend where the first region 1137a is not formed. On the other hand, FIG. 15A illustrates the short side bend where the first region 1137a is not formed (white diamond) and the short side bend where the first region 1137a is formed (black circle) as follows. The short side bend where the first region 1137a is formed has a smaller absolute stress value than that of the short side bend where the first region 1137a is not formed.

Figure 15B:
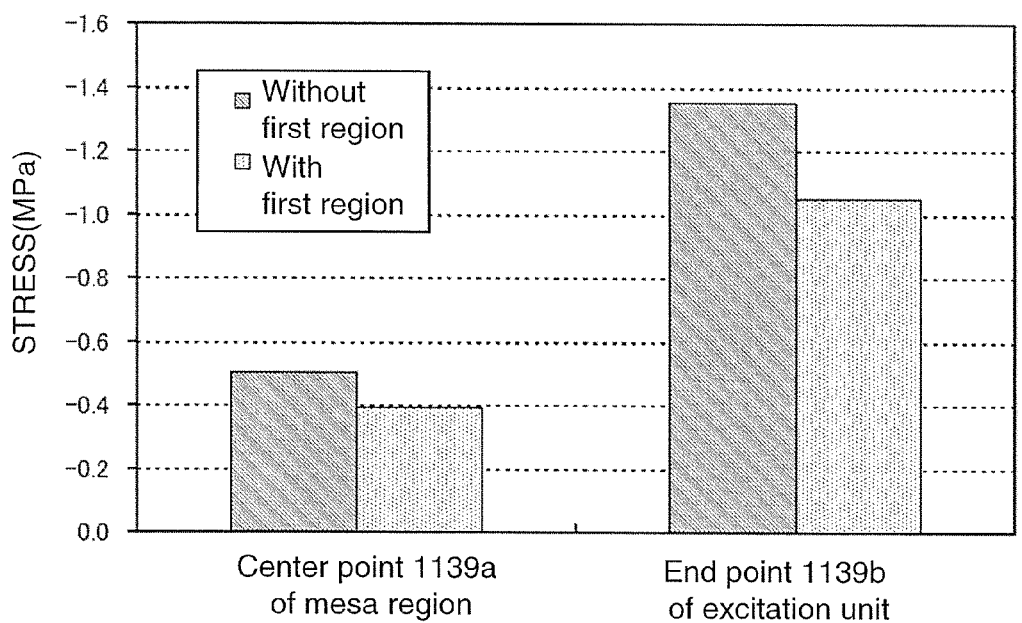
FIG. 15B is a graph illustrating the stresses of a center point 1139a in a mesa region 1131a and an end point 1139b at the −X axis side of the excitation unit 1131 in the case where a short side bend is performed.

FIG. 15B is a graph illustrating the stresses on the center point 1139a of the mesa region 1131a and the end point 1139b at the −X axis side of the excitation unit 1131 when the short side bend is performed. The center point 1139a and the end point 1139b are on the horizontal axis while the stress is on the vertical axis. FIG. 15B illustrates stresses on the respective points both with and without the first region 1137a in. At the center point 1139a of the mesa region 1131a, the stress where the first region 1137a is not formed is −0.501 MPa while the stress where the first region 1137a is formed is −0.390 MPa. At the end point 1139b of the excitation unit 1131, the stress where the first region 1137a is not formed is −1.354 MPa while the stress where the first region 1137a is formed is −1.049 MPa. At the center point 1139a of the mesa region 1131a and the end point 1139b of the excitation unit 1131, the stress where the first region 1137a is formed is smaller than the stress where the first region 1137a is not formed. At the end point 1139b of the excitation unit 1131, the stress where the first region 1137a is formed has the intensity reduced by about 22% compared with the stress where the first region 1137a is not formed.

FIGS. 15A and 15B illustrate the results as follows. The piezoelectric vibrating piece 1130 includes the framing portion 1132 where the first region 1137a is formed. This reduces stress on the excitation unit 1131. The piezoelectric vibrating piece 1130 with the first region 1137a has a smaller stress on the end point 1139b of the excitation unit 1131 adjacent to the connecting portion 1133 than that of the piezoelectric vibrating piece 1130 without the first region 1137a. This is considered to reduce stress on the connecting portion 1133. Accordingly, forming the first region does not reduce impact resistance of the piezoelectric vibrating piece. Therefore, the piezoelectric vibrating piece 1130 reduces stress on the excitation unit 1131 thanks to the formation of the first region 1137a in the framing portion 1132 without degrading the impact resistance. This prevents variation in characteristics such as vibration frequency of the piezoelectric vibrating piece. In the piezoelectric vibrating piece where the excitation unit, the framing portion, and the connecting portion are formed, the connecting portion with a longer length in the X axis direction prevents stress on the framing portion from transferring to the excitation unit, thus reducing the stress on the excitation unit. Forming the first region in the framing portion reduces the stress on the excitation unit similarly to the connecting portion with a longer length in the X axis direction. That is, even in the case where the connecting portion has a short length in the X axis direction, forming the first region of the framing portion reduces the stress on the excitation unit. In the piezoelectric vibrating piece, forming the connecting portion with a shorter length in the X axis direction ensures increased design margin of the excitation unit, which is preferred.

The piezoelectric vibrating piece 1130 has the second region 1137b of the framing portion 1132 that is bonded to the lid plate 1110 and the base plate 1120. This configuration hermetically seals the piezoelectric device 1100. Thus, the length LC is longer than the length LB. In order to ensure a firmly bonded region so as not to break sealing in the piezoelectric device 1100, it is preferred that the length LB be equal to or less than a half of the length LC.

Fifth Embodiment

The first region, which is formed in the framing portion, and connected to the connecting portion, may be formed in various shapes that is different from the first region in the piezoelectric vibrating piece 1130. Additionally, the first region is formed corresponding to a position of the connecting portion in the piezoelectric vibrating piece. Hereinafter, a description will be given of a piezoelectric vibrating piece with a different first region from that of the piezoelectric vibrating piece 1130. In the following description, like reference numerals designate corresponding or identical elements of the piezoelectric vibrating piece 1130, and therefore such elements will not be further elaborated here.

Configuration of a Piezoelectric Vibrating Piece 1230

Figure 16A:
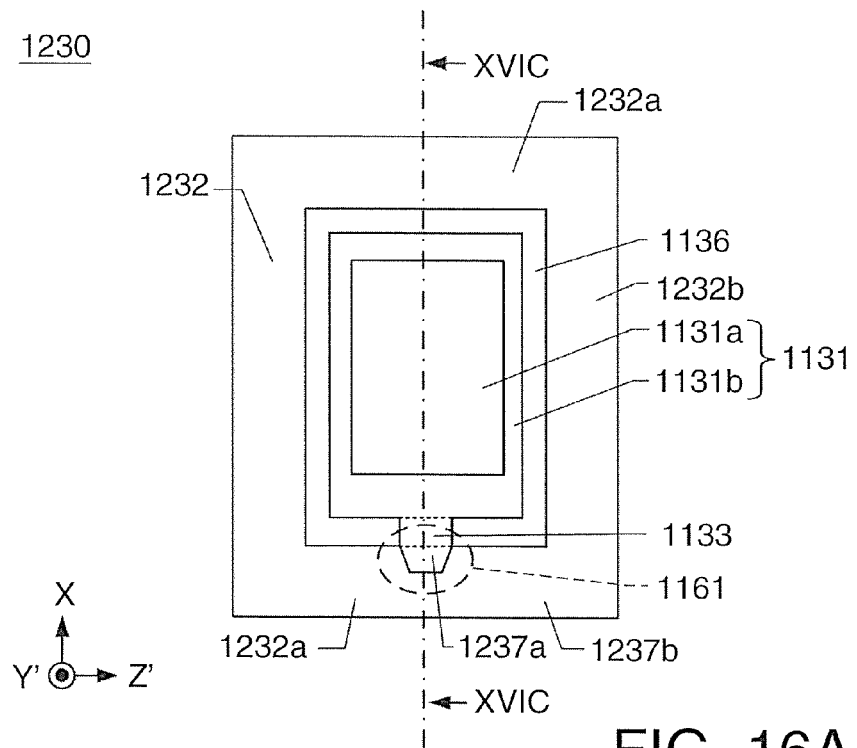
FIG. 16A is a plan view of a piezoelectric vibrating piece 1230 without electrodes.

FIG. 16A is a plan view of a piezoelectric vibrating piece 1230 without electrodes. The piezoelectric vibrating piece 1230 includes the excitation unit 1131, which includes the mesa region 1131a and the peripheral region 1131b, a framing portion 1232, which surrounds the excitation unit 1131, and the connecting portion 1133, which connects the excitation unit 1131 and the framing portion 1232 together. The framing portion 1232 includes a first framing body 1232a, which extends in the Z' axis direction, and a second framing body 1232b, which extends in the X axis direction. The framing portion 1232 has the first framing body 1232a at the −X axis side where a first region 1237a and a second region 1237b are formed. The first region 1237a has the same thickness as that of the connecting portion 1133, and is connected to the connecting portion 1133. The second region 1237b is thicker than the first region 1237a. The piezoelectric vibrating piece 1230 includes the second framing body 1232b and the first framing body 1232a with the second region 1237b. The lid plate 1110 is bonded to the surface at the +Y' axis side of the second framing body 1232b and the second region 1237b, while the base plate 1120 is bonded to the surface at the −Y' axis side of the second framing body 1232b and the first framing body 1232a. This forms the piezoelectric device.

Figure 16B:
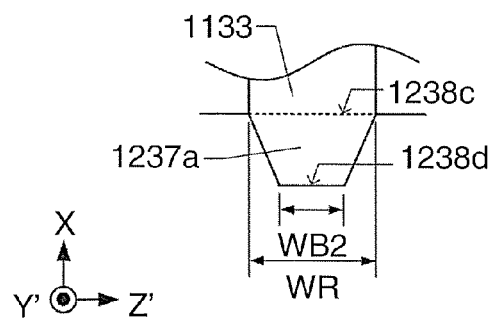
FIG. 16B is an enlarged view of a region enclosed by a dotted line 1161 of FIG. 16A.

FIG. 16B is an enlarged view of a region enclosed by a dotted line 1161 in FIG. 16A. Assume that the side of the first region 1237a at the +X axis side is a third side 1238c, and the side of the first region 1237a at the −X axis side is a fourth side 1238d. The third side 1238c has a length WR that is the same as the length of the connecting portion 1133 in the Z' axis direction. The fourth side 1238d has a length WB2. The length WB2 is shorter than the length WR. The third side 1238c and the fourth side 1238d are connected together at their respective ends in a straight line. That is, the first region 1237a has a trapezoidal planar shape. In the piezoelectric vibrating piece 1230, forming the first region 1237a reduces stress on the excitation unit 1131, and forming the length WB2 shorter than the length WR enlarges the area of the second region 1237b. This firmly bonds the framing portion 1232 to the lid plate 1110 and the base plate 1120, thus firmly sealing the piezoelectric device.

Figure 16C:
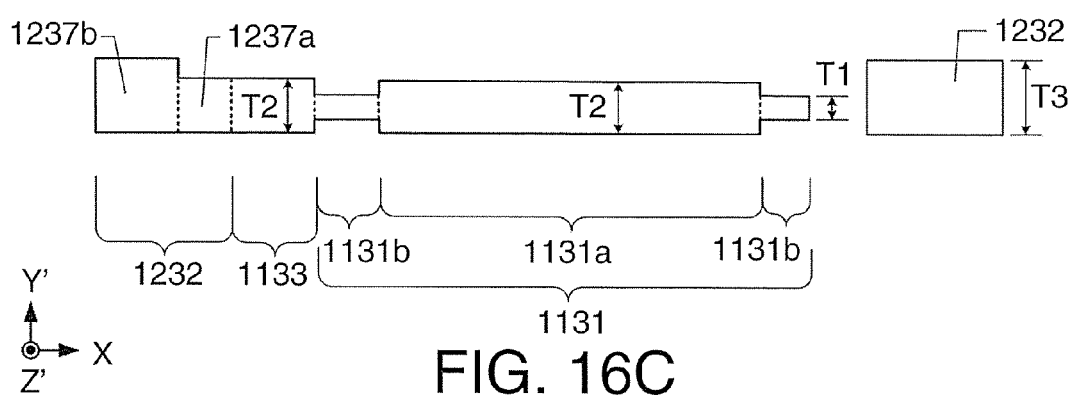
FIG. 16C is a cross-sectional view taken along the line XVIC-XVIC of a piezoelectric vibrating piece 1230a in FIG. 16A.

FIG. 16C is a cross-sectional view of a piezoelectric vibrating piece 1230a. The piezoelectric vibrating piece 1230a is a modification of the piezoelectric vibrating piece 1230. FIG. 16C illustrates a cross-sectional view taken along the line XVIC-XVIC of FIG. 16A. The piezoelectric vibrating piece 1230a has a second thickness T2 in the Y' axis direction of the connecting portion 1133 and the first region 1237a, and is otherwise similar to the piezoelectric vibrating piece 1230. Forming the connecting portion 1133 and the first region 1237a thicker improves impact resistance of the piezoelectric vibrating piece 1230a. The configuration where the connecting portion and the first region have such a thicknesses may be applied to the piezoelectric vibrating piece 1130 in the fourth embodiment and the other piezoelectric vibrating pieces in the fifth embodiment. In the case where the difference in level between: the connecting portion 1133 with the first region 1237a, and the peripheral region 113 lb is equal to the difference in level between the mesa region 1131a and the peripheral region 1131b, this allows forming the connecting portion 1133, the first region 1237a, and the mesa region 1131a at the same time. This facilitates the fabrication process, which is preferred.

Configuration of a Piezoelectric Vibrating Piece 1330

FIG. 17A is a plan view of a piezoelectric vibrating piece 1330 without electrodes. The piezoelectric vibrating piece 1330 includes the excitation unit 1131, which includes the mesa region 1131a and the peripheral region 1131b, a framing portion 1332, which surrounds the excitation unit 1131, and the connecting portion 1133, which connects the excitation unit 1131 and the framing portion 1332 together. The framing portion 1332 includes a first framing body 1332a, which extends in the Z' axis direction, and a second framing body 1332b, which extends in the X axis direction. The framing portion 1332 has the first framing body 1332a at the −X axis side where a first region 1337a and a second region 1337b are formed. The first region 1337a has the same thickness as that of the connecting portion 1133, and is connected to the connecting portion 1133. The second region 1337b is thicker than the first region 1337a. The piezoelectric vibrating piece 1330 includes the second framing body 1332b and the first framing body 1332a with the second region 1337b. The lid plate 1110 is bonded to the surface at the +Y' axis side of the second framing body 1332b and the second region 1337b, while the base plate 1120 is bonded to the surface at the −Y' axis side of the second framing body 1332b and the first framing body 1332a. This forms the piezoelectric device.

FIG. 17B is an enlarged view of a region enclosed by a dotted line 1162 in FIG. 17A. Assume that the side of the first region 1337a at the +X axis side is a third side 1238c, while the side of the first region 1337a at the −X axis side is the fourth side 1238d. This first region 1337a has a shape corresponding to a shape of the above-described first region 1137a (see FIG. 14A) except that the corner portions at the −X axis side are chamfered to form planar surfaces 1338e in the piezoelectric vibrating piece 1130. The framing portion undergoes stress from a printed circuit board and a similar member. Especially, the stress easily concentrates on a pointed portion such as the corner portion in the first region. This may generate cracking or a similar trouble starting from the corner portion, thus possibly damaging the piezoelectric vibrating piece. The first region with chamfered corner portions prevents stress from concentrating on the corner portions of the first region. This prevents the piezoelectric vibrating piece 1330 from damaging, thus improving impact resistance.

FIG. 17C is a plan view of a first region 1337a where the corner portions are rounded with curved surfaces. FIG. 17C illustrates the first region 1337a in the following configuration. The piezoelectric vibrating piece 1330 includes the first region 1337a with the fourth side 1238d. The fourth side 1238d has both ends where the corner portions are rounded with curved surfaces 1338f. As illustrated in FIG. 17C, the first region 1337a is rounded with curved surfaces 1338f. Similarly to the first region 1337a in FIG. 17B, this eliminates concentration of stress on the corner portion of the first region, thus improving impact resistance of the piezoelectric vibrating piece.

Configuration of a Piezoelectric Vibrating Piece 1430

FIG. 18A is a plan view of a piezoelectric vibrating piece 1430 without electrodes. The piezoelectric vibrating piece 1430 includes the excitation unit 1131, which includes the mesa region 1131a and the peripheral region 1131b, a framing portion 1432, which surrounds the excitation unit 1131, and the connecting portion 1133, which connects the excitation unit 1131 and the framing portion 1432 together. The framing portion 1432 includes a first framing body 1432a, which extends in the Z' axis direction, and a second framing body 1432b, which extends in the X axis direction. The framing portion 1432 has the first framing body 1432a at the −X axis side where a first region 1437a and a second region 1437b are formed. The first region 1437a has the same thickness as that of the connecting portion 1133, and is connected to the connecting portion 1133. The second region 1437b is thicker than the first region 1437a. The piezoelectric vibrating piece 1430 has the second framing body 1432b and the first framing body 1432a with the second region 1437b. The lid plate 1110 is bonded to the surface at the +Y' axis side of the second framing body 1432b and the second region 1437b. The base plate 1120 is bonded to the surface at the −Y' axis side of the second framing body 1432b and the first framing body 1432a. This forms the piezoelectric device.

FIG. 18B is an enlarged view of a region enclosed by a dotted line 1163 in FIG. 18A. Assume that the side of the first region 1437a at the +X axis side is a third side 1438c, while the side of the first region 1437a at the −X axis side is the fourth side 1238d. The third side 1438c and the fourth side 1238d have the same length WB2, and the first region 1437a is formed in a rectangular shape. In the piezoelectric vibrating piece 1430, forming the first region 1437a reduces stress on the excitation unit 1131, and forming the length WB2 shorter than the length WR enlarges the area of the second region compared with the piezoelectric vibrating piece 1130. This firmly bonds the framing portion 1432 to the lid plate 1110 and the base plate 1120, thus firmly sealing the piezoelectric device.

Configuration of a Piezoelectric Vibrating Piece 1530

FIG. 18C is a plan view of a piezoelectric vibrating piece 1530 without electrodes. The piezoelectric vibrating piece 1530 includes the excitation unit 1131, which includes the mesa region 1131a and the peripheral region 1131b, a framing portion 1532, which surrounds the excitation unit 1131, the connecting portion 1133, which connects the excitation unit 1131 and the framing portion 1532 together. The framing portion 1532 includes a first framing body 1532a, which extends in the Z' axis direction, and a second framing body 1532b, which extends in the X axis direction. The framing portion 1532 has the first framing body 1532a at the −X axis side where a first region 1537a and a second region 1537b are formed. The first region 1537a has the same thickness as that of the connecting portion 1133, and is connected to the connecting portion 1133. The second region 1537b is thicker than the first region 1537a. In the piezoelectric vibrating piece 1530, the lid plate 1110 is bonded to the surface at the +Y' axis side of the second region 1537b, while the base plate 1120 is bonded to the surface at the −Y' axis side of the first framing body 1532a. This forms the piezoelectric device.

FIG. 18D is an enlarged view of a region enclosed by a dotted line 1164 in FIG. 18C. Assume that the side of the first region 1537a at the +X axis side is a third side 1538c, while the side of the first region 1537a at the −X axis side is a fourth side 1538d. The third side 1538c and the fourth side 1538d have the same length WB3, while the first region 1537a is formed in a rectangular shape. The length WB3 is longer than the length WR. In the piezoelectric vibrating piece 1530, forming the first region 1537a with the length WB3 that is longer than the length WR of the connecting portion 1133 enlarges the area of the first region 1537a. This reduces stress on the excitation unit 1131 compared with the piezoelectric vibrating piece 1130.

Configuration of a Piezoelectric Vibrating Piece 1630

FIG. 19A is a plan view of a piezoelectric vibrating piece 1630 without electrodes. The piezoelectric vibrating piece 1630 includes the excitation unit 1131, which includes the mesa region 1131a and the peripheral region 1131b, a framing portion 1632, which surrounds the excitation unit 1131, and a connecting portion 1633, which connects the excitation unit 1131 and the framing portion 1632 together. A region, which is other than the connecting portion 1633, between the excitation unit 1131 and the framing portion 1632 forms a through hole 1636 that passes through the piezoelectric vibrating piece 1630 in the Y' axis direction. The connecting portion 1633 is connected to the end at the −Z' axis side on the side of the excitation unit 1131 at the −X axis side, and has a length WR in the Z' axis direction. The framing portion 1632 includes a first framing body 1632a, which extends in the Z' axis direction, and a second framing body 1632b, which extends in the X axis direction. The framing portion 1632 has the first framing body 1632a at the −X axis side where a first region 1637a and a second region 1637b are formed. The first region 1637a has the same thickness as that of the connecting portion 1633, and is connected to the connecting portion 1633. The second region 1637b is thicker than the first region 1637a. In the piezoelectric vibrating piece 1630, the first region 1637a has the length WR in the Z' axis direction, which is the same as that of the connecting portion 1633 in the Z' axis direction.

Configuration of a Piezoelectric Vibrating Piece 1730

FIG. 19B is a plan view of a piezoelectric vibrating piece 1730 without electrodes. The piezoelectric vibrating piece 1730 includes the excitation unit 1131, which includes the mesa region 1131a and the peripheral region 1131b, a framing portion 1732, which surrounds the excitation unit 1131, the connecting portions 1733, which connect the excitation unit 1131 and the framing portion 1732 together. A region, which is other than the connecting portions 1733, between the excitation unit 1131 and the framing portion 1732 forms a through hole 1736 that passes through the piezoelectric vibrating piece 1730 in the Y' axis direction. The connecting portions 1733 are connected to the respective ends at the −Z' axis side and the +Z' axis side on the first side 1138a, which is the side at the −X axis side of the excitation unit 1131. The framing portion 1732 includes a first framing body 1732a, which extends in the Z' axis direction, and a second framing body 1732b, which extends in the X axis direction. The framing portion 1732 has the first framing body 1732a at the −X axis side where first regions 1737a and a second region 1737b are formed. The first regions 1737a have the same thickness as that of the connecting portions 1733, and are connected to the respective connecting portions 1733. The second region 1737b is thicker than the first regions 1737a. The respective connecting portions 1733 and the respective first regions 1737a each have a length WR2 in the Z' axis direction.

The piezoelectric vibrating piece 1630 and the piezoelectric vibrating piece 1730 are different from the piezoelectric vibrating piece 1130 in a position of the connecting portions. According to the descriptions of the piezoelectric vibrating piece 1630 and the piezoelectric vibrating piece 1730, the piezoelectric vibrating piece has the framing portion where the connecting portion is connected to the first region. The first region may be formed corresponding to the forming position of the connecting portion.

Representative embodiments have been described in detail above. As evident to those skilled in the art, this disclosure may be changed or modified in various ways within the technical scope of this disclosure. The first and second embodiments may be combined with the third to fifth embodiments.

While in the embodiments the piezoelectric vibrating pieces employ an AT-cut quartz-crystal vibrating pieces, a BT-cut quartz-crystal vibrating pieces, which vibrate in a thickness-shear vibration mode, or a similar piece may also be used, similarly to the AT-cut quartz-crystal vibrating pieces. Further, the piezoelectric vibrating pieces are basically applied to piezoelectric material including not only quartz-crystal material but also lithium tantalite, lithium niobate, and piezoelectric ceramic.

According to a first aspect of this disclosure, a piezoelectric vibrating piece includes an excitation unit in a rectangular shape, a framing portion that surrounds the excitation unit, a connecting portion, and a protrusion. The excitation unit includes a pair of principal surfaces, a pair of excitation electrodes on the pair of principal surfaces, a first side that extends in a first direction, and a second side that extends in a second direction. The second side is longer than the first side. The second direction is perpendicular to the first direction. The connecting portion connects the first side of the excitation unit to the framing portion. The connecting portion is thinner than the framing portion. The protrusion protrudes in the thickness direction in at least one of the connecting portion and a region between the connecting portion and the excitation electrode. The excitation electrode is formed in the second direction of the connecting portion. The length of the protrusion in the first direction is equal to or longer than a length of the connecting portion in the first direction.

According to a second aspect of the piezoelectric vibrating piece in the first aspect, the connecting portion is connected to the center of the first side in the excitation unit.

According to a third aspect of the piezoelectric vibrating piece in the first and second aspects, both the principal surfaces include the protrusion. The protrusion on one principal surface and the protrusion on the other principal surface are symmetrical in the thickness direction.

According to a fourth aspect of the piezoelectric vibrating piece in the first to third aspects, the excitation unit includes a mesa region and a peripheral region around the mesa region. The mesa region includes the excitation electrode. The peripheral region is thinner than the mesa region. The peripheral region has the same thickness as that of the connecting portion.

According to a fifth aspect of the piezoelectric vibrating piece in the fourth aspect, the protrusion has a height in the thickness direction. The height is equal to a height in the thickness direction from the peripheral region of the mesa region.

The piezoelectric device according to a sixth aspect includes a piezoelectric vibrating piece according to the first to fifth aspects, a lid plate bonded to one principal surface of the framing portion in the piezoelectric vibrating piece, and a base plate bonded to the other principal surface of the framing portion in the piezoelectric vibrating piece.

According to a seventh aspect of the piezoelectric vibrating piece includes an excitation unit in a rectangular shape, a framing portion, and a connecting portion. The excitation unit includes a pair of principal surfaces, a pair of excitation electrodes on the pair of principal surfaces, a first side that extends in a first direction, and a second side that extends in a second direction. The second side is longer than the first side. The second direction is perpendicular to the first direction. The framing portion includes a first framing body that extends in the first direction and a second framing body that extends in the second direction. The first framing body and the second framing body surround the excitation unit. The first framing body includes a first region that has a first thickness and a second region that is thicker than the first thickness. The connecting portion has the first thickness. The connecting portion connects the first side of the excitation unit to the first region of the first framing body. The first framing body has a length in the second direction, and this length is longer than a length of the first region in the second direction.

According to an eighth aspect of the piezoelectric vibrating piece in the seventh aspect, the number of the connecting portion is one. The connecting portion is connected to the center of the first side in the excitation unit.

According to a ninth aspect of the piezoelectric vibrating piece in the seventh aspect, the connecting portion is connected to at least one end of the first side in the excitation unit.

According to a tenth aspect of the piezoelectric vibrating piece in the seventh to ninth aspects, the first region includes a third side and a fourth side. The third side is in contact with the connecting portion. The third side extends in the first direction. The fourth side is the opposite side of the third side in the connecting portion of the first region. The third side has a length that is equal to or longer than a length of the fourth side.

According to an eleventh aspect of the piezoelectric vibrating piece in the tenth aspect, the first region includes corner portions in contact with both sides of the fourth side. The corner portions include one of a curved surface and a planar surface.

According to a twelfth aspect of the piezoelectric vibrating piece in the tenth or eleventh aspect, the third side has a length that is equal to or less than a length of the connecting portion in the first direction.

According to a thirteenth aspect of the piezoelectric vibrating piece in the seventh to twelfth aspects, the first region has the length in the second direction that is a half or less than the half of the length of the first framing body in the second direction.

According to a fourteenth aspect of the piezoelectric vibrating piece in the seventh to thirteenth aspects, the excitation unit includes a mesa region and a peripheral region around the mesa region. The mesa region includes the excitation electrode. The peripheral region is thinner than the mesa region. The peripheral region has the first thickness.

The piezoelectric device according to a fifteenth aspect includes a piezoelectric vibrating piece in the seventh to fourteenth aspects, a lid plate bonded to one principal surface of the framing portion in the piezoelectric vibrating piece, and a base plate bonded to the other principal surface of the framing portion in the piezoelectric vibrating piece.

The piezoelectric vibrating piece and the piezoelectric device according to this disclosure reduce the influence of stress on the excitation unit.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric vibrating piece, comprising:
    an excitation unit in a rectangular shape, the excitation unit including:
        a pair of principal surfaces;
        a pair of excitation electrodes on the pair of principal surfaces;
        a first side that extends in a first direction; and
        a second side that extends in a second direction, the second side being longer than the first side, the second direction being perpendicular to the first direction;
    a framing portion including:
        a first framing body that extends in the first direction, the first framing body including a first region with a first thickness and a second region, the second region being thicker than the first thickness; and
        a second framing body that extends in the second direction, the first framing body and the second framing body surrounding the excitation unit;
    a connecting portion with the first thickness, the connecting portion connecting the first side of the excitation unit to the first region of the first framing body; and
    a protrusion that protrudes in the thickness direction in at least one of the connecting portion and a region between the connecting portion and the excitation electrode, the excitation electrode being disposed in the second direction of the connecting portion, wherein,
    the first framing body has a length in the second direction, the length being longer than a length of the first region in the second direction, and
    the length of the protrusion in the first direction is equal to or longer than a length of the connecting portion in the first direction.

2. A piezoelectric vibrating piece, comprising:
    an excitation unit in a rectangular shape, the excitation unit including:
        a pair of principal surfaces;
        a pair of excitation electrodes on the pair of principal surfaces;
        a first side that extends in a first direction; and
        a second side that extends in a second direction, the second side being longer than the first side, the second direction being perpendicular to the first direction;
    a framing portion that surrounds the excitation unit;
    a connecting portion that connects the first side of the excitation unit to the framing portion, the connecting portion being thinner than the framing portion; and
    a protrusion that protrudes in the thickness direction in at least one of the connecting portion and a region between the connecting portion and the excitation electrode, the excitation electrode being disposed in the second direction of the connecting portion, wherein,
    the length of the protrusion in the first direction is equal to or longer than a length of the connecting portion in the first direction.

3. The piezoelectric vibrating piece according to claim 2, wherein,
    the connecting portion is connected to a center of the first side in the excitation unit.

4. The piezoelectric vibrating piece according to claim 3, wherein,
    the protrusion are on both the principal surfaces,
    the protrusion on one principal surface and the protrusion on the other principal surface are symmetrical in the thickness direction.

5. The piezoelectric vibrating piece according to claim 2, wherein,
    the excitation unit includes a mesa region and a peripheral region around the mesa region, the mesa region including the excitation electrode, the peripheral region being thinner than the mesa region, and
    the peripheral region has a thickness that is equal to a thickness of the connecting portion.

6. The piezoelectric vibrating piece according to claim 5, wherein,
    the protrusion has a height in the thickness direction,
    the height being equal to a height in the thickness direction from the peripheral region of the mesa region.

7. A piezoelectric device, comprising:
    a piezoelectric vibrating piece according to claim 2;
    a lid plate bonded to one principal surface of the framing portion in the piezoelectric vibrating piece; and
    a base plate bonded to another principal surface of the framing portion in the piezoelectric vibrating piece.

8. A piezoelectric vibrating piece, comprising:
    an excitation unit in a rectangular shape, the excitation unit including:
        a pair of principal surfaces;
        a pair of excitation electrodes on the pair of principal surfaces;
        a first side that extends in a first direction; and
        a second side that extends in a second direction, the second side being longer than the first side, the second direction being perpendicular to the first direction;
    a framing portion including:
        a first framing body that extends in the first direction, the first framing body including a first region with a first thickness and a second region, the second region being thicker than the first thickness; and a second framing body that extends in the second direction, the first framing body and the second framing body surrounding the excitation unit, and a connecting portion with the first thickness, the connecting portion connecting the first side of the excitation unit to the first region of the first framing body, wherein, the first framing body has a length in the second direction, the length being longer than a length of the first region in the second direction.

9. The piezoelectric vibrating piece according to claim 8, wherein, the number of the connecting portion is one, and the connecting portion is connected to a center of the first side in the excitation unit.

10. The piezoelectric vibrating piece according to claim 8, wherein, the connecting portion is connected to at least one end of the first side in the excitation unit.

11. The piezoelectric vibrating piece according to claim 8, wherein, the first region includes:

a third side at an side of the connecting portion, the third side extending in the first direction; and a fourth side at an opposite side of the connecting portion in the first region, and the third side has a length that is equal to or longer than a length of the fourth side.

12. The piezoelectric vibrating piece according to claim 11, wherein, the first region includes corner portions at both ends of the fourth side, the corner portions including one of a curved surface and a planar surface.

13. The piezoelectric vibrating piece according to claim 11, wherein, the third side has a length that is equal to or less than a length of the connecting portion in the first direction.

14. The piezoelectric vibrating piece according to claim 8, wherein, the length of the first region in the second direction is a half or less than the half of the length of the first framing body in the second direction.

15. The piezoelectric vibrating piece according to claim 8, wherein, the excitation unit includes a mesa region and a peripheral region around the mesa region, the mesa region including the excitation electrode, the peripheral region being thinner than the mesa region, and the peripheral region has the first thickness.

16. A piezoelectric device, comprising:

a piezoelectric vibrating piece according to claim 8;

a lid plate bonded to one principal surface of the framing portion in the piezoelectric vibrating piece; and a base plate bonded to another principal surface of the framing portion in the piezoelectric vibrating piece.

* * * * *